(12) United States Patent
Nakamura et al.

(10) Patent No.: US 10,534,033 B2
(45) Date of Patent: Jan. 14, 2020

(54) IC SOCKET

(71) Applicant: YAMAICHI ELECTRONICS CO., LTD., Tokyo (JP)

(72) Inventors: Yuji Nakamura, Tokyo (JP); Masashi Iwata, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 36 days.

(21) Appl. No.: 15/758,692

(22) PCT Filed: Aug. 23, 2016

(86) PCT No.: PCT/JP2016/074559
§ 371 (c)(1),
(2) Date: Mar. 8, 2018

(87) PCT Pub. No.: WO2017/064927
PCT Pub. Date: Apr. 20, 2017

(65) Prior Publication Data
US 2018/0238957 A1    Aug. 23, 2018

(30) Foreign Application Priority Data

Oct. 16, 2015 (JP) .................................. 2015-204812

(51) Int. Cl.
*G01R 31/26* (2014.01)
*G01R 1/04* (2006.01)
*G01R 1/067* (2006.01)
*H01R 33/76* (2006.01)

(52) U.S. Cl.
CPC ............ *G01R 31/26* (2013.01); *G01R 1/0433* (2013.01); *G01R 1/06722* (2013.01); *H01R 33/76* (2013.01)

(58) Field of Classification Search
CPC .. G01R 31/26; G01R 1/06722; G01R 1/0433; H05K 7/1007; H05K 7/1061; H01R 33/76; H01R 13/2421; H01R 24/50
USPC ......................................................... 439/626
See application file for complete search history.

(56) References Cited

U.S. PATENT DOCUMENTS

2004/0212381 A1   10/2004   Yoshida et al.
2004/0212383 A1   10/2004   Yanagisawa et al.
(Continued)

FOREIGN PATENT DOCUMENTS

JP    2004-325305 A    11/2004
JP    2004-325306 A    11/2004
(Continued)

OTHER PUBLICATIONS

Notification of Concerning Transmittal of Translation of the International Preliminary Report on Patentability (Chapter I); PCT/JP2016/074559; dated Apr. 17, 2018.
(Continued)

*Primary Examiner* — Farhana A Hoque
(74) *Attorney, Agent, or Firm* — Studebaker & Brackett PC

(57) ABSTRACT

When each signal line contact terminal (10*ai*) is installed in a base member (30), an upper housing (28), and a lower housing (26), the upper housing (28) is installed together in such a way as to be sandwiched between the base member (30) and the lower housing (26). Here, collars (16) are fitted on outer peripheral portions of a first extending portion (52A) and a second extending portion (52C) of the signal line contact terminal (10*ai*), respectively. Moreover, air layers are formed between an outer peripheral portion of a drum portion (52B) of the signal line contact terminal (10*ai*) and an inner peripheral surface forming a hole (28*b*), between an outer peripheral portion of the first extending (Continued)

portion (52A) and an inner peripheral surface forming a hole (30b), between an outer peripheral portion of the second extending portion (52C) and an inner peripheral surface forming a hole (26b), and between an outer peripheral portion of a plunger (56) and an inner peripheral surface forming a hole (26e).

8 Claims, 42 Drawing Sheets

(56) References Cited

U.S. PATENT DOCUMENTS

| 2006/0094134 | A1 | 5/2006 | Yoshida | |
|---|---|---|---|---|
| 2012/0115366 | A1* | 5/2012 | Suzuki | G01R 1/0466 |
| | | | | 439/626 |

FOREIGN PATENT DOCUMENTS

| JP | 2005-351785 A | 12/2005 |
|---|---|---|
| JP | 2006-125988 A | 5/2006 |
| JP | 4242199 B2 | 1/2009 |
| JP | 2009-129877 A | 6/2009 |
| JP | 2012-98219 A | 5/2012 |

OTHER PUBLICATIONS

Notification of Transmittal of Translation of Written Opinion of the International Searching Authority; PCT/JP2016/074559; dated Oct. 16, 2016.

International Search Report issued in PCT/JP2016/074559; dated Oct. 25, 2016.

* cited by examiner

IC SOCKET

TECHNICAL FIELD

The present invention relates to an IC socket.

BACKGROUND ART

A semiconductor device serving as an electronic device to be mounted on an electronic equipment or the like is generally subjected to a test for eliminating potential defects therein by using an Integrated Circuit socket (IC socket) at a stage before the semiconductor device is mounted. As shown in PATENT DOCUMENT 1, for example, such an IC socket is provided on a printed wiring board (a test board or a mounting board).

In the case where a semiconductor device socket is provided in a transmission line that transmits an RF (radio frequency) signal in a relatively high frequency band such as 1 GHz or above, there has been known a technique for enhancing a transmission performance of a signal in a relatively high frequency band by subjecting an IC socket to impedance matching in order to enhance the transmission performance of the signal in the relative high frequency band, and decreasing inductance by further reducing a length between a contact portion of a movable terminal portion of a contact terminal and a proximal end portion of a solder fixation terminal portion thereof.

As shown in PATENT DOCUMENT 1, for example, a contact probe serving as the contact terminal is disposed in an insertion hole in a metal block of the IC socket to be disposed on the wiring board.

Such an IC socket comprises, as its main elements: the metal block fixed to a surface of a wiring board through an insulating board made of a resin; a guide plate stacked on an upper end portion of the metal block through another insulating board made of a resin; and a plurality of contact probes.

Among the plurality of contact probes, an RF signal contact probe is fixed in such a way as to define a hollow portion that forms an air layer between an outer peripheral portion of the probe and the insertion hole in the metal block mentioned above, and is configured to form a so-called coaxial probe that the contact probe is adopted as a central conductor and an inner wall of the insertion hole is adopted as an external conductor. Hereby, impedance matching is achieved. However, a portion of each insulating board into which each plunger of the RF signal contact probe is to be inserted is not formed into the coaxial probe. Moreover, among the plurality of contact probes, a power supply contact probe is covered with a dielectric tube around an outer peripheral portion of a barrel thereof. Herewith, a metal pipe of the power supply contact probe is insulated from the inner wall of the insertion hole in the metal block. Furthermore, among the plurality of contact probes, a grounding contact probe is arranged such that an outer peripheral portion of a metal pipe thereof comes into contact with the inner wall of the insertion hole in the metal block.

And then, as disclosed in PATENT DOCUMENT 2, for example, there has been proposed a technique to provide an annular dielectric body for slidably supporting each of an upper plunger and a lower plunger at each open end portion of an insertion hole of a base from which each of the upper plunger and the lower plunger projects, in order to achieve the impedance matching with respect to a portion between a base of a socket and each of the upper plunger and the lower plunger projecting from the barrel of the signal probe in the PATENT DOCUMENT 1 described above, such that the portion does not form the coaxial probe and hence causes impedance mismatching. The dielectric body has a support hole which is located at a central part and each of the upper plunger and the lower plunger can slide.

PRIOR ART DOCUMENTS

Patent Documents

PATENT DOCUMENT 1: Japanese Patent No. 4,242,199
PATENT DOCUMENT 2: Japanese Patent Application Publication No. 2009-129877

SUMMARY OF INVENTION

In order to allow each of the upper plunger and the Lower plunger of the signal probe in PATENT DOCUMENT 2 described above to smoothly slide in the support hole in the dielectric body, it is necessary to provide a predetermined clearance between an outer peripheral portion of each of the upper plunger and the lower plunger and an inner peripheral portion of the support hole. Such a predetermined clearance is set while taking into account machining accuracy of the outer peripheral portion of each of the upper plunger and the lower plunger, wear of the support hole, and the like. At that time, a flange portion of the dielectric body is fixed to the periphery of the open end portion of the insertion hole in the base.

However, the clearance may cause a deviation of the axis of the upper plunger and the lower plunger from the center of the supporting hole in the dielectric body, which is likely to result in the deviation of the impedance without achieving prescribed concentricity. Moreover, there is also a limitation to enhance in concentricity of each of the upper plunger and the lower plunger to the dielectric body. For example, the clearance may become a contributor to the impedance mismatching in a relatively high frequency band in excess of about 60 GHz. Moreover, the impedance mismatching may also be resulted from an end portion of the flange portion of the dielectric body projecting from an end surface of a base member.

In view of the above-described problem, the present invention aims to provide an IC socket. The IC socket can enhance impedance accuracy without being affected by a clearance required for sliding a plunger, and is also capable of enhancing impedance matching even in a relatively high frequency band of a signal.

To achieve the above-described object, an IC socket according to the present invention comprises: an upper housing made of an electrically conductive material and including a plurality of holes configured to individually accommodate a plurality of contact terminals at given clearance, the contact terminals corresponding to at least signal lines in a semiconductor device to be connected, each hole having open ends provided on both ends configured to allow passage of each contact terminal; a base member made of an electrically conductive material, provided on one of end surfaces of the upper housing, including holes each configured to allow passage of a first plunger of each of the contact terminals while retaining a predetermined clearance, and configured to support the first plunger inside each hole through a collar made of a dielectric body; and a lower housing made of an electrically conductive material, provided on the other end surfaces of the upper housing, including holes each configured to allow passage of a second plunger of each of the contact terminals while retaining a predetermined clearance, and configured to support the second plunger inside each hole through a collar made of a dielectric body.

Moreover, the contact terminal may include: the first plunger and the second plunger; an elastic member configured to bias the first plunger and the second plunger in directions to move away from each other; and a barrel configured to accommodate the first plunger, the second plunger, and the elastic member. The barrel may include an extending portion provided at an end portion of the barrel and configured to slidably guide any one of the first plunger and the second plunger inside, and the extending portion may be supported by the collar made of a low dielectric body.

An air layer may be formed between an inner peripheral surface forming the hole in the upper housing and an outer peripheral portion of the contact terminal. Moreover, the semiconductor device to be connected may be placed on the base member through a sheet made of a resin and including a plurality of holes each configured to allow passage of a contact portion of the contact terminal. The upper housing and the lower housing are grounded. Furthermore, a diameter of a contact portion formed at a contact end portion of the first plunger of the contact terminal maybe set larger than a diameter of the another portion of the contact end portion, and set substantially equal to an outside diameter of the extending portion of the barrel.

The IC socket according to the present invention comprises: the upper housing made of the electrically conductive material and including the plurality of holes configured to individually accommodate the contact terminals at given clearance; the base member made of the electrically conductive material, provided on the one end surface of the upper housing, including the holes each configured to allow passage of the first plunger of each of the contact terminals while retaining the predetermined clearance, and configured to support the first plunger inside each hole through the collar made of the dielectric body; and the lower housing made of the electrically conductive material, provided on the other end surface of the upper housing, including the holes configured to allow passage of the second plunger of each of the contact terminals while retaining the predetermined clearance, and configured to support the second plunger inside each hole through the collar made of the dielectric body. Thus, any of cross sections of the upper housing, the lower housing, and the base member intersecting the center axis of the contact terminal forms a so-called coaxial probe structure set to predetermined impedance. Accordingly, it is possible to enhance impedance accuracy without being affected by a clearance required for sliding each plunger, and to enhance impedance matching even in a relatively high frequency band of a signal.

DESCRIPTION OF EMBODIMENTS

Figure 2A:
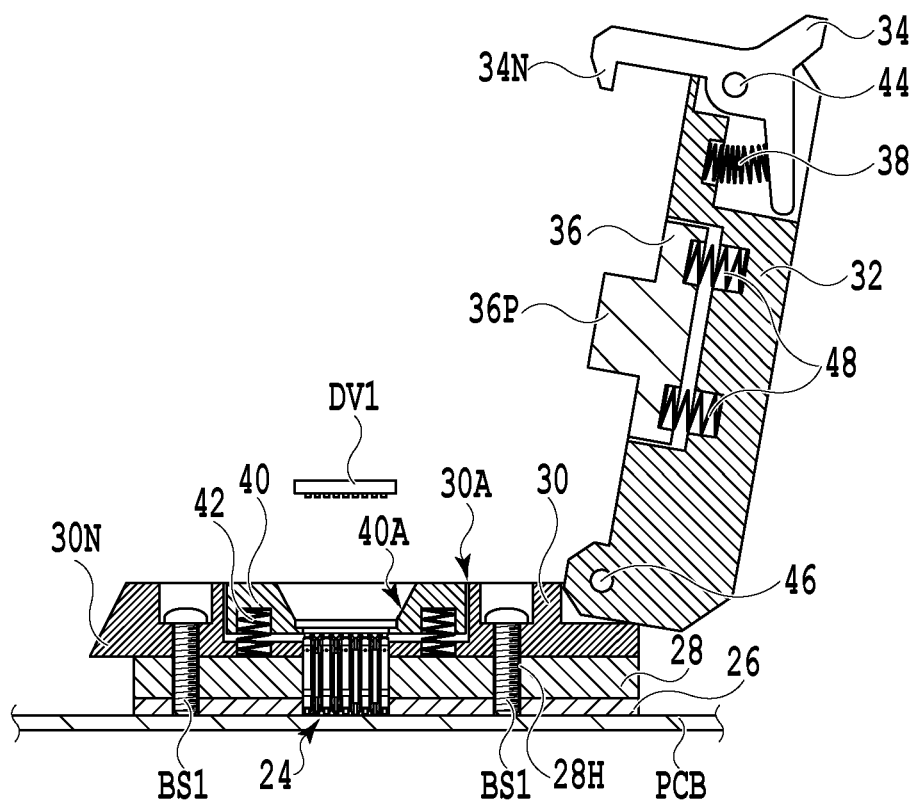
FIG. 2A is a cross-sectional view schematically showing an overall configuration of the first embodiment of the IC socket according to the present invention.

FIG. 2A schematically shows a configuration of a first embodiment of an IC socket according to the present invention.

In FIG. 2A, a plurality of IC sockets are disposed on a printed wiring board PCB serving as a test board, for example. Note that FIG. 2A representatively illustrates one IC socket on the printed wiring board PCB.

The printed wiring board PCB is made of glass epoxy resin, for example, and has an electrode group (not shown) which is provided with a plurality of electrode pads that are formed in a matrix corresponding to a layout of contact terminals to be described later, and is located at a substantially central part on one of surface portions. Through-holes into which machine screws to be described later are inserted are formed at four positions around the electrode group.

For example, the IC socket is provided with a pressing mechanism unit of a clam shell type, an upper housing 28, a lower housing 26, and a contact terminal group 24 to be provided inside the upper housing 28 and the lower housing 26.

The pressing mechanism unit comprises a base member 30 placed on an upper end surface of the upper housing 28, and a lid member 32 rotationally movably supported by an end portion of the base member 30 and movably holding a pressing body 36 that presses an electrode surface of an attached semiconductor device DV1 against the contact terminal group 24 to be described later.

The semiconductor device DV1 is provided with an integrated circuit inside a BGA type package, for example. A plurality of electrode portions DVa (see FIGS. 1, 3A, and 4) are formed in a matrix at a bottom portion of the semiconductor device DV1. When the semiconductor device DV1 is positioned at a semiconductor device placing portion to be described later, the respective electrode portions DVa of the semiconductor device DV1 are inserted into an opening 41C (see FIG. 3A) formed in the semiconductor device placing portion or into respective cells (see FIG. 4).

External dimensions of the base member 30 made of a metal material such as aluminum are set substantially equal to external dimensions of the upper housing 28 and the lower housing 26. An opening 30A in which a positioning plate 40 to be described later is disposed is formed at a central part of the base member 30.

The positioning plate 40 is fixed to the base member 30 in a vertically movable manner by using a plurality of machine screws. The positioning plate 40 is biased by a plurality of coil springs 42 to a direction to move away from an inner surface forming a bottom portion of the opening 30A with a predetermined clearance from the inner surface. The plurality of coil springs 42 are provided between respective dents in the positioning plate 40 and respective dents in the base member 30.

Figure 2B:
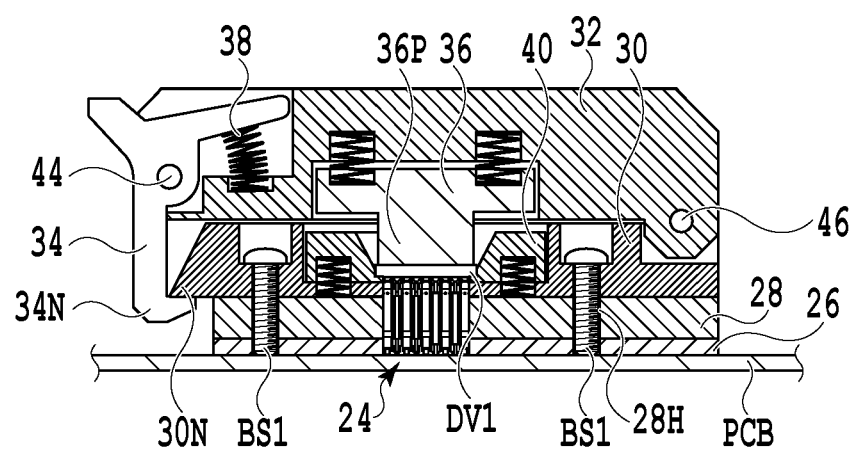
FIG. 2B is a cross-sectional view of an example shown in FIG. 2A, in which a lid in a state of being held by a base member is illustrated together with a semiconductor device.
Figure 2C:
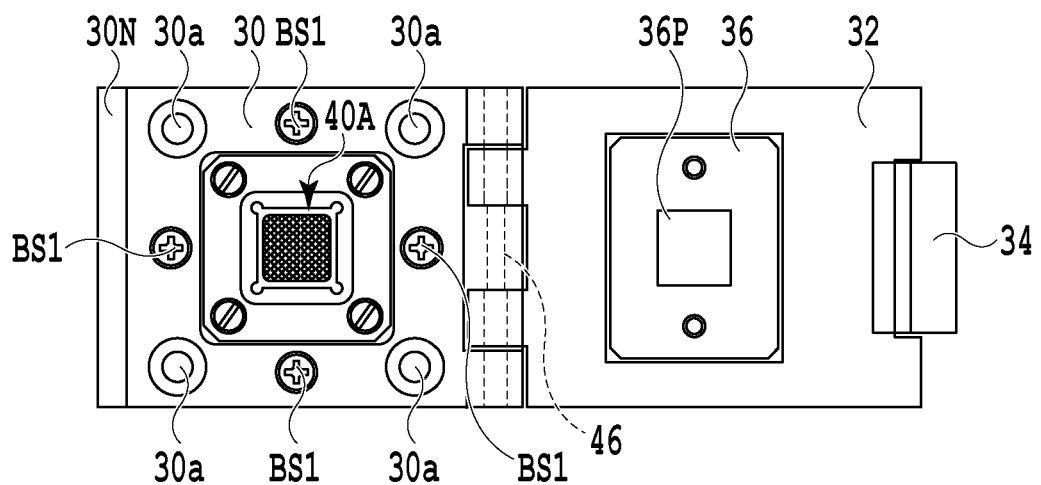
FIG. 2C is a plan view of the example shown in FIG. 2A.

The positioning plate 40 has a semiconductor placing portion 40A located at its central part where the semiconductor device DV1 is mounted and demounted. As shown in the partial enlarged view of FIG. 4, the semiconductor placing portion 40A open upward is formed by being surrounded by inclined surface portions on four sides that guide the semiconductor device DV1 at the time of mounting. Step portions 40S are formed at bottom edges of the respective inclined surface portions so as to receive edges around the electrode group at a package of the semiconductor device DV1. As shown in FIG. 2C, both sides of each step portion 40S along each side of the package of the semiconductor device DV1 are connected to ends of adjacent step portions 40S, respectively. Both ends of each step portion 40S are provided with recesses corresponding to corner portions of the package of the semiconductor device DV1 to be attached. As shown in the partial enlarged view of FIG. 4, grid-like partition walls 40Pi (i=1 to n, n is a positive integer) that form cells corresponding to the respective electrode portions DVa of the semiconductor device DV1 are formed integrally with the step portions 40S at a central part of the positioning plate 40 surrounded by the step portions 40S. An air layer is formed between each electrode portion DVa and the corresponding partition wall 40Pi in order to avoid short circuit between each electrode portion DVa and the base member 30.

Holes into which respective contact portions of the contact terminal group to be described later are inserted are formed in the base member 30 at positions immediately below the respective cells of the positioning plate 40.

As shown in FIG. 2C, holes 30a into which fixation machine screws (not shown) are to be inserted, respectively, are formed at four corners around the above-described opening 30A so as to correspond to the holes in the upper housing 28 and the lower housing 26. Thus, the base member 30, the upper housing 28, and the lower housing 26 are fixed to the printed wiring board PCB as a consequence of the fixation machine screws being fastened by use of nuts and washers through the holes 30a, and the through- holes in the upper housing 28, the lower housing 26, and the printed wiring board PCB described above. Moreover, the base member 30 is integrated with the upper housing 28 and the lower housing 26 as a consequence of machine screws BS1 being screwed into female screw holes in the lower housing 26 through the holes in the base member 30 and the holes in the upper housing 28.

An end portion of the lid member 32 is rotationally movably supported by the base member 30 through a support shaft 46. A latch member 34 is rotationally movably provided at another end portion of the lid member 32 so as to establish a state of holding the lid member 32 onto the base member 30 as shown in FIG. 2B or a state of releasing the lid member 32 as shown in FIG. 2A. The latch member 34 is rotationally movably supported by the lid member 32 through a support shaft 44 that penetrates a central part of a cross section of the latch member 34. A nib portion 34N on one end thereof is selectively fixed to a lock portion 30N of the base member 30. Another end of the latch member 34 is biased in a counterclockwise direction in FIG. 2A with a coil spring 38. The coil spring 38 is provided between the other end of the latch member 34 and a bottom portion of a recess of the lid member 32.

When the above-described lid member 32 is held by the base member 30, the pressing body 36 is supported by machine screws and movably provided inside a recess at a central part on an inner surface side of the lid member 32 opposed to the base member 30. The pressing body 36 is biased by a plurality of coil springs 48 to such a direction that a tip end of an outer portion of the pressing body 36 moves away from an opening of the lid member 32. Each coil spring 48 is disposed between an inner peripheral portion that forms a bottom portion of the recess and an end portion of the pressing body 36 opposed to the bottom portion of the recess. A pressing projection 36P projecting toward the base member 30 is formed at a central part of a portion of the pressing body 36 opposed to the base member 30. As shown in FIG. 2B, when the lid member 32 is held onto the base member 30 in a state where the semiconductor device DV1 is mounted on the semiconductor placing portion, an end surface of the pressing projection 36P is configured to come into contact with an upper surface of the package of the semiconductor device DV1 and to press the semiconductor device DV1 against the contact terminal group.

The upper housing 28 is formed into a flat plate shape by using an electrically conductive metal material such as an aluminum alloy material having a predetermined thickness. The upper housing 28 includes through-holes 28H provided at four positions, into which the respective machine screws BS1 are inserted corresponding to the holes in the base member 30 described above. Moreover, although illustration is omitted, the upper housing 28 is provided with holes corresponding to the holes 30a in the base member 30 into which the fixation machine screws (not shown) are inserted. Moreover, an upper surface and a lower surface of the upper housing 28 are provided with two positioning pins (not shown) for positioning the base member 30 and the lower housing 26 relative to the upper housing 28, respectively. The two positioning pins provided on the upper surface and the lower surface, respectively, are engaged with positioning holes in the base member 30 and the lower housing 26.

Figure 1:
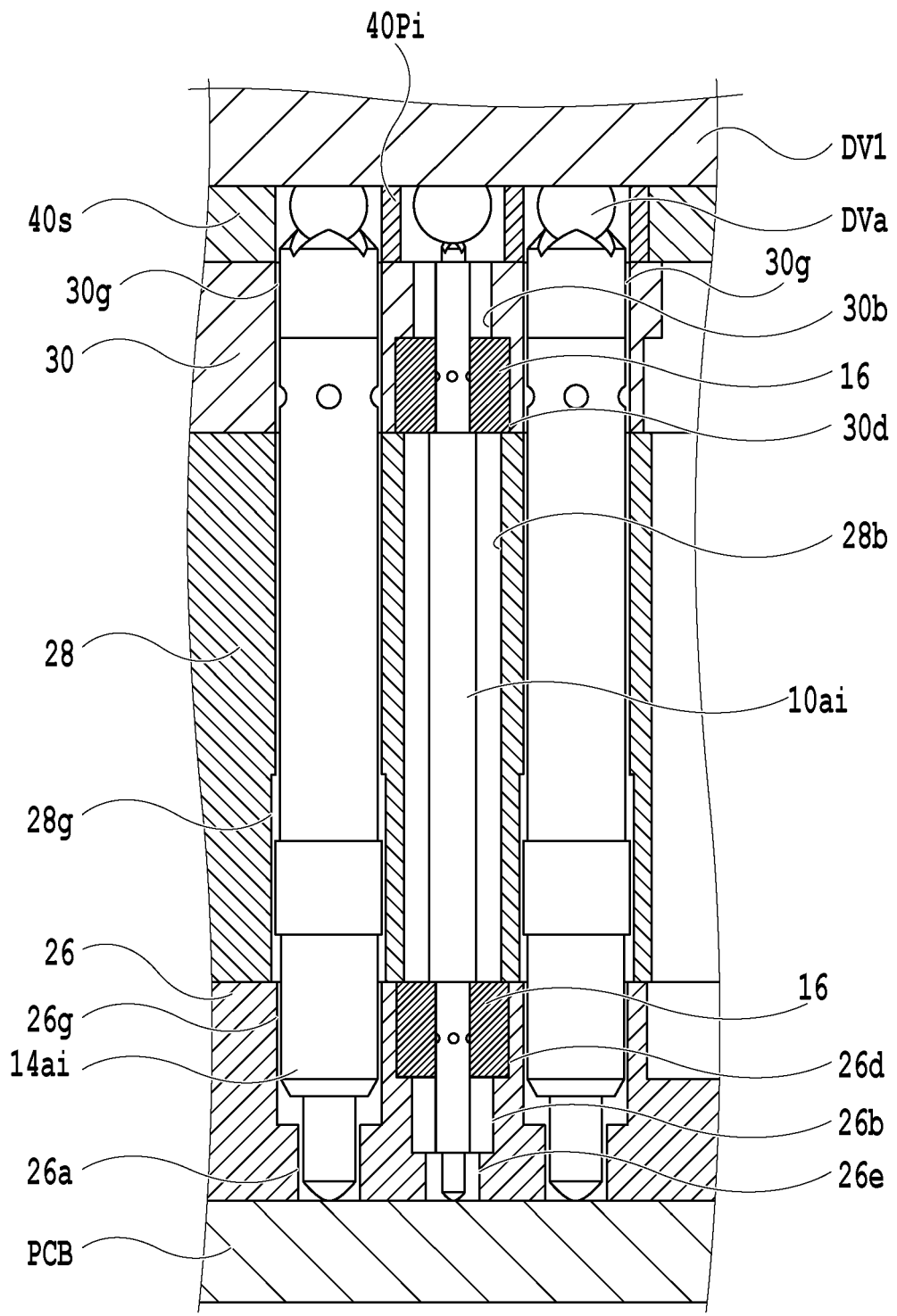
FIG. 1 is a partial cross-sectional view showing an enlarged main part of a configuration of a first embodiment of an IC socket according to the present invention.
Figure 4:
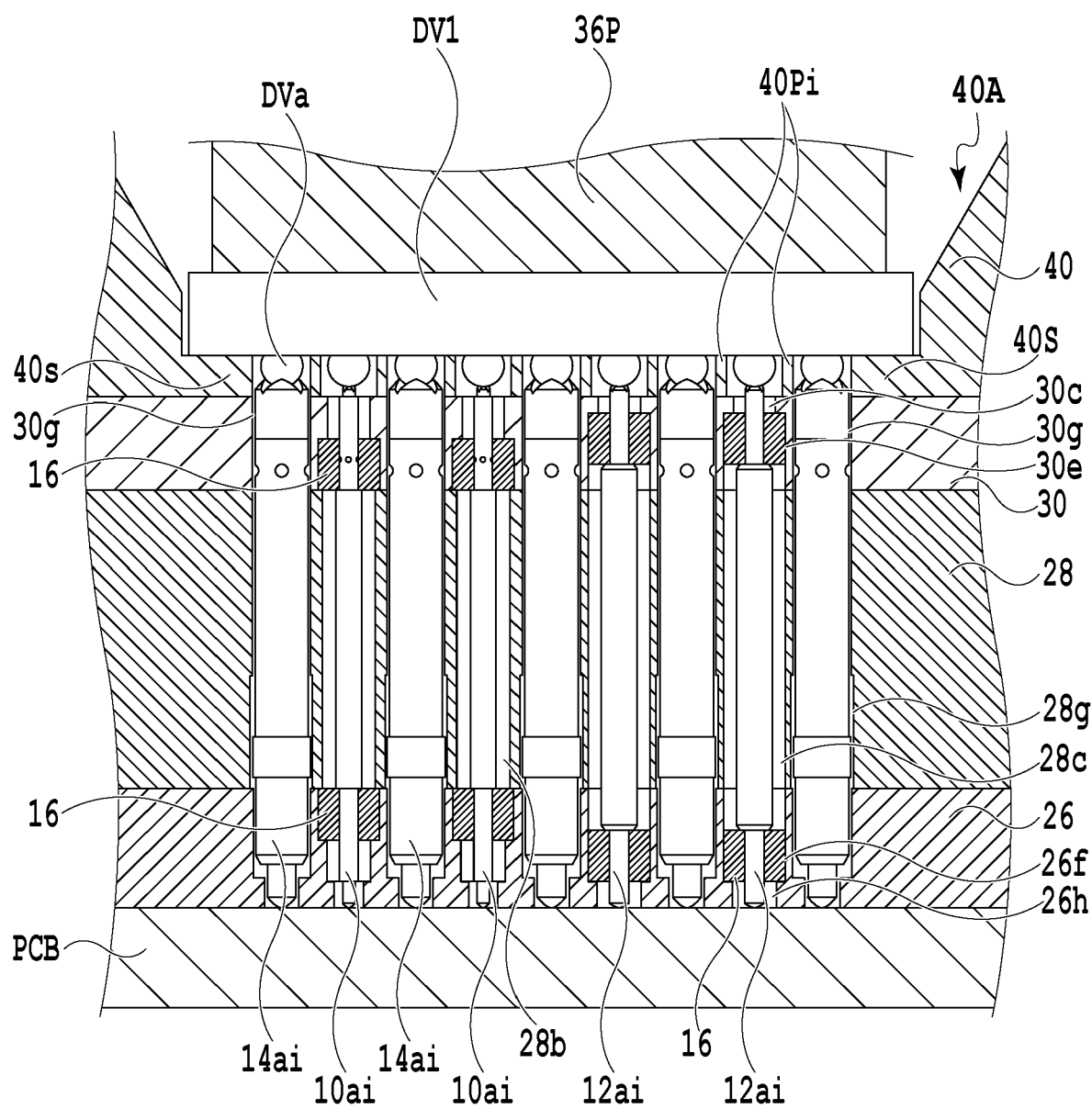
FIG. 4 is a partial cross-sectional view showing an enlarged part illustrated in FIG. 2B.
Figure 6:
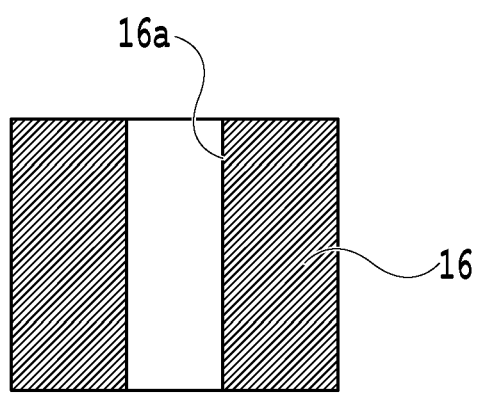
FIG. 6 is a cross-sectional view showing a collar used in the example illustrated in FIG. 2A.

Furthermore, as shown in FIGS. 1 and 4, holes 28g, 28b, and 28c are formed substantially perpendicularly to the surface of the printed wiring board PCB at positions in the upper housing 28 located immediately below the respective cells of the above-described positioning plate 40 as well as below holes 30g, 30b, and 30c in the base member 30. Grounding line contact terminals 14ai to be described later are inserted into the holes 30g and 28g. Signal line contact terminals 10ai are inserted into the holes 30b and 28b. Power supply contact terminals 12ai are inserted into the holes 30c and 28c, respectively. A collar 16 shown in the enlarged view of FIG. 6 is inserted into each hole 30d communicating with the corresponding hole 30b. The collar 16 having a hole 16a at the center is molded by using a low dielectric material such as TEFLON (registered trademark), for example. Since the collar 16 is molded by using the low dielectric material as described above, it is possible to set an outside diameter of the collar 16 to a relatively small value, so that narrower pitches of the arrangement of the contact terminals in the IC socket can be planned. A diameter of each hole 30d is set larger than a diameter of the corresponding hole 30b. A step portion is formed between the hole 30d and the hole 30b which are formed on the common center axis. Another collar 16 is inserted into each hole 30e communicating with the corresponding hole 30c. A diameter of each hole 30e is set larger than a diameter of the corresponding hole 30c. A step portion is formed between the hole 30e and the hole 30c which are formed on the common center axis.

Figure 3A:
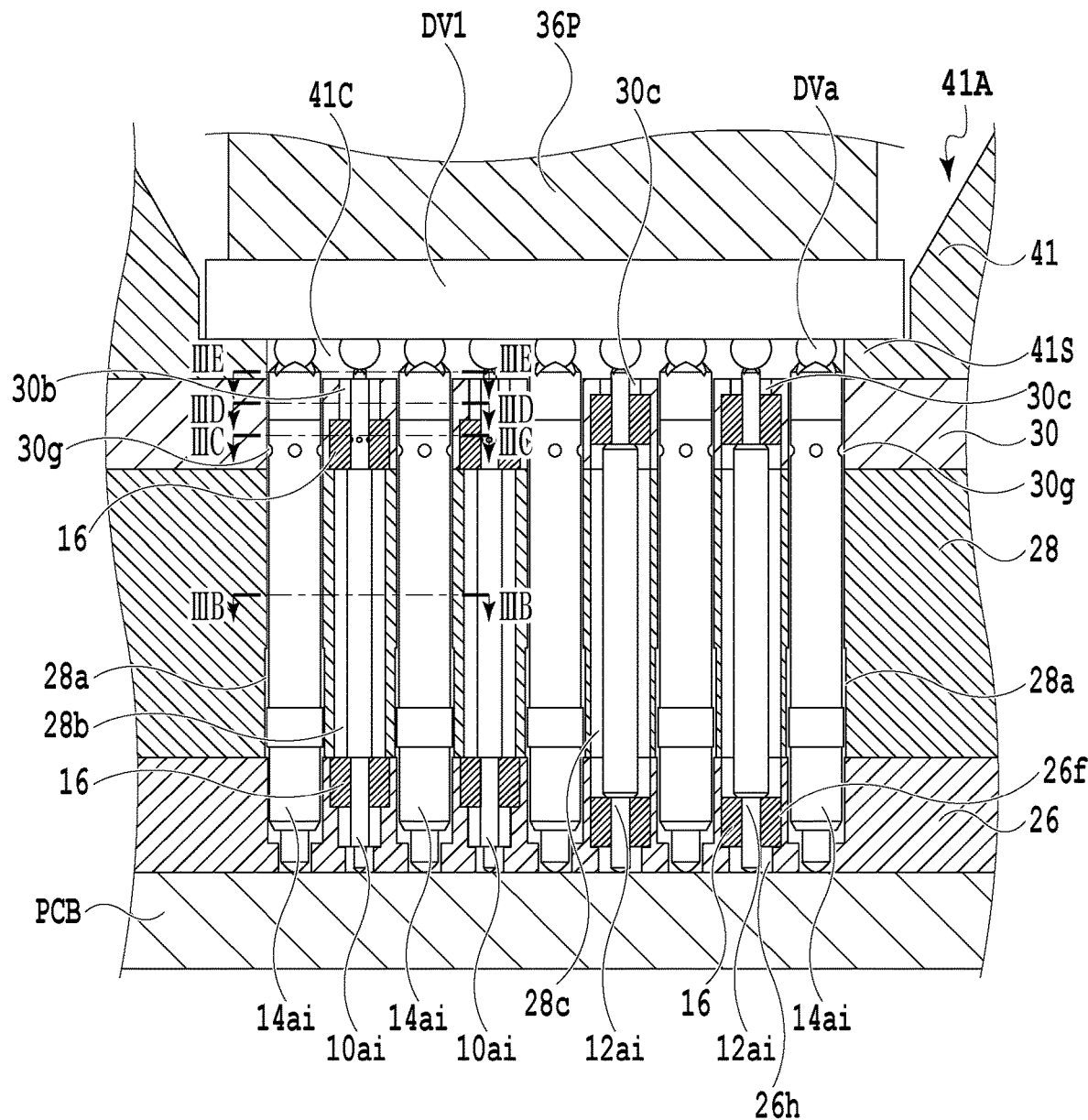
FIG. 3A is an enlarged partial cross-sectional view showing another example of a positioning plate used in the example illustrated in FIG. 2A together with a contact terminal group.
Figure 3B:
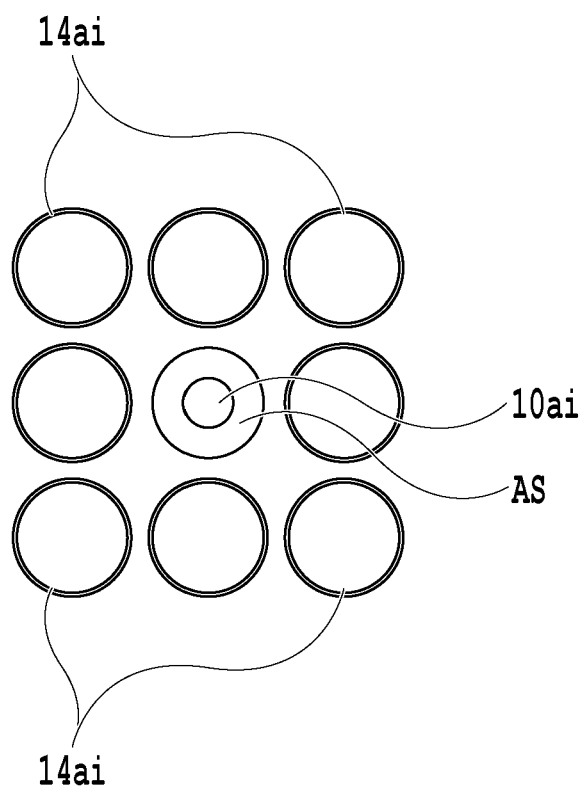
FIG. 3B is a cross-sectional view taken along the IIIB-IIIB line in FIG. 3A.
Figure 3C:
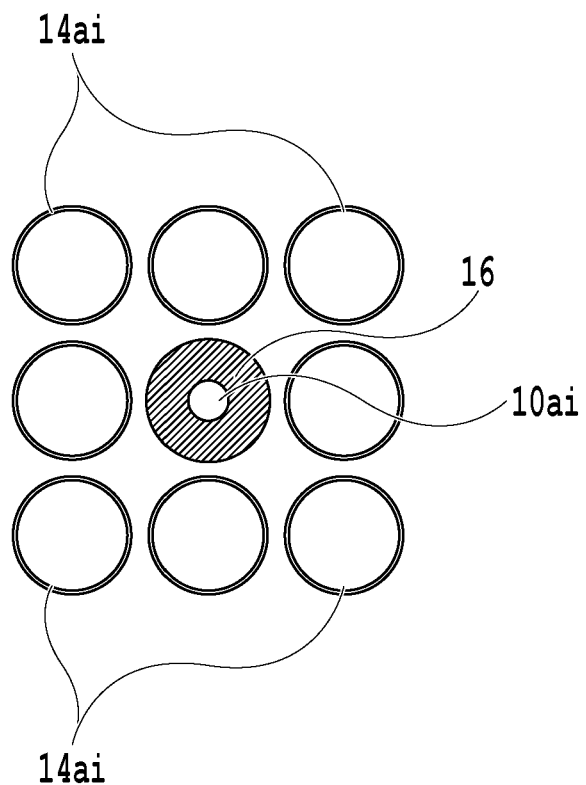
FIG. 3C is a cross-sectional view taken along the IIIC-IIIC line in FIG. 3A.

Hereby, each signal line contact terminal 10ai is disposed between the adjacent grounding line contact terminals 14ai as shown in FIGS. 3B and 3C. Moreover, each power supply contact terminal 12ai is disposed between the adjacent grounding line contact terminals 14ai.

The lower housing 26 is formed into a flat plate shape by using an electrically conductive metal material such as an aluminum alloy material having a predetermined thickness. The lower housing 26 has the female screw holes corresponding to the through-holes 28H in the upper housing 28 described above. Moreover, although illustration is omitted, holes corresponding to the holes 30a in the base member 30, into which the fixation machine screws (not shown) are inserted, are provided in the lower housing 26.

Moreover, as shown in FIGS. 1 and 4, holes 26g, 26d, and 26f are formed substantially perpendicularly to the surface of the printed wiring board PCB in the lower housing 26 so as to correspond to the holes 28g, 28b, and 28c in the upper housing 28 described above.

Another collar 16 is inserted into the hole 26d. A diameter of the hole 26d is set larger than a diameter of the hole 28b. Holes 26b and 26e communicating with the hole 26d are formed on the common center axis. A diameter of the hole 26b is set smaller than the diameter of the hole 26d, and is set larger than a diameter of the hole 26e. Step portions are formed between the hole 26d and the hole 26b, and between the hole 26b and the hole 26e, respectively.

Another collar 16 is also inserted into the hole 26f. A diameter of the hole 26f is set substantially equal to a diameter of the hole 28c. A diameter or a hole 26h communicating with the hole 26f is set smaller than the diameter of the hole 26f. Accordingly, a step portion is formed between the hole 26f and the hole 26h.

Note that the upper housing 28 and the lower housing 26 are electrically connected to grounding lines (not shown) of the printed wiring board PCB.

Figure 5A:
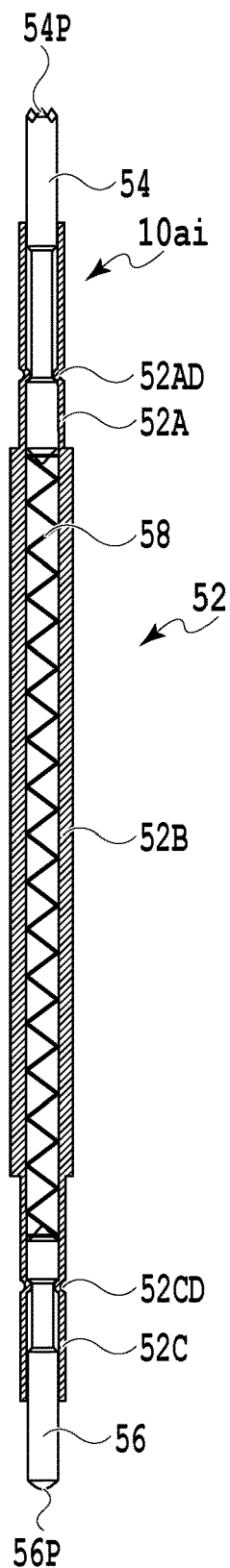
FIG. 5A is a cross-sectional view showing a signal line contact terminal used in the example illustrated in FIG. 2A.

As shown in the enlarged view of FIG. 5A, each signal line contact terminal 10ai (i=1 to n, n is a positive integer) comprises: a plunger 54 provided with a contact portion 54P configured to selectively come into contact with the corresponding electrode portion DVa of the semiconductor device DV1; a plunger 56 provided with a contact portion 56P configured to come into contact with a corresponding contact pad on the printed wiring board PCB; and a barrel 52 accommodating a coil spring 58 serving as an elastic member to bias the plunger 54 and the plunger 56 in directions to move away from each other, and configured to connect the plunger 54 to the plunger 56 in such a way as to be capable of coming close to and moving away from each other.

The plunger 54 serving as a first plunger comprises: a contact end portion made of a beryllium copper alloy, for example, and provided with the contact portion 54P formed on one end; a spring receiving portion to receive one end of the coil spring 58; and a connecting portion to connect the contact end portion to the spring receiving portion. Diameters of the contact end portion and the spring receiving portion are made equal to each other, and are set larger than a diameter of the connecting portion. Part of the contact end portion of the plunger 54 projects outward from an end portion of a cylindrical first extending portion 52A of the barrel 52 to be described later. A step portion formed at a boundary portion between the connecting portion and the spring receiving portion of the plunger 54 is fixed to a plurality of nibs 52AD at the first extending portion 52A. Herewith, a movement of the contact end portion of the plunger 54 in a direction toward the electrode portion DVa of the semiconductor device DV1 is limited and an amount of outward projection of the contact end portion of the plunger 54 is set.

The plunger 56 serving as a second plunger comprises: a contact end portion made of a beryllium copper alloy, for example, and provided with the substantially conical contact portion 56P formed on one end; a spring receiving portion to receive another end of the coil spring 58; and a connecting portion to connect the contact end portion to the spring receiving portion. Diameters of the contact end portion and the spring receiving portion are made equal to each other, and are set larger than a diameter of the connecting portion. Part of the contact end portion of the plunger 56 projects outward from an end portion of a cylindrical second extending portion 52C of the barrel 52 to be described later. A step portion formed at a boundary portion between the connecting portion and the spring receiving portion of the plunger 56 is fixed to a plurality of nibs 52CD at the second extending portion 52C. Hereby, a movement of the contact end portion of the plunger 56 in a direction toward the contact pad on the printed wiring board PCB is limited and an amount of outward projection of the contact end portion of the plunger 56 is set.

The barrel 52 is made of phosphor bronze and formed into a cylindrical shape, for example. The barrel 52 comprises the first extending portion 52A which slidably guides the plunger 54 at a given stroke, the second extending portion 52C which slidably guides the plunger 56 at a given stroke, and a drum portion 52B which connects the first extending portion 52A to the second extending portion 52C. The drum portion 52B is formed integrally with the first extending portion 52A and the second extending portion 52C. A diameter of the drum portion 52B is set larger than diameters of the first extending portion 52A and the second extending portion 52C.

Figure 3D:
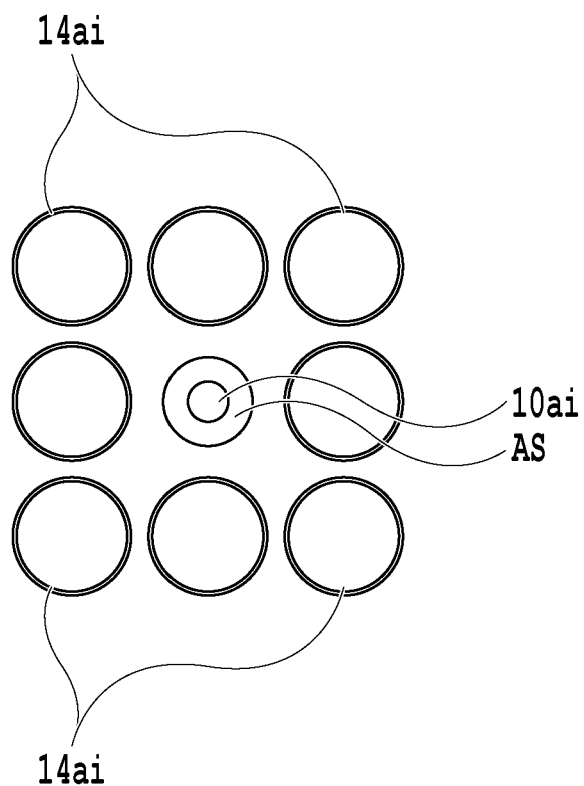
FIG. 3D is a cross-sectional view taken along the IIID-IIID line in FIG. 3A.
Figure 3E:
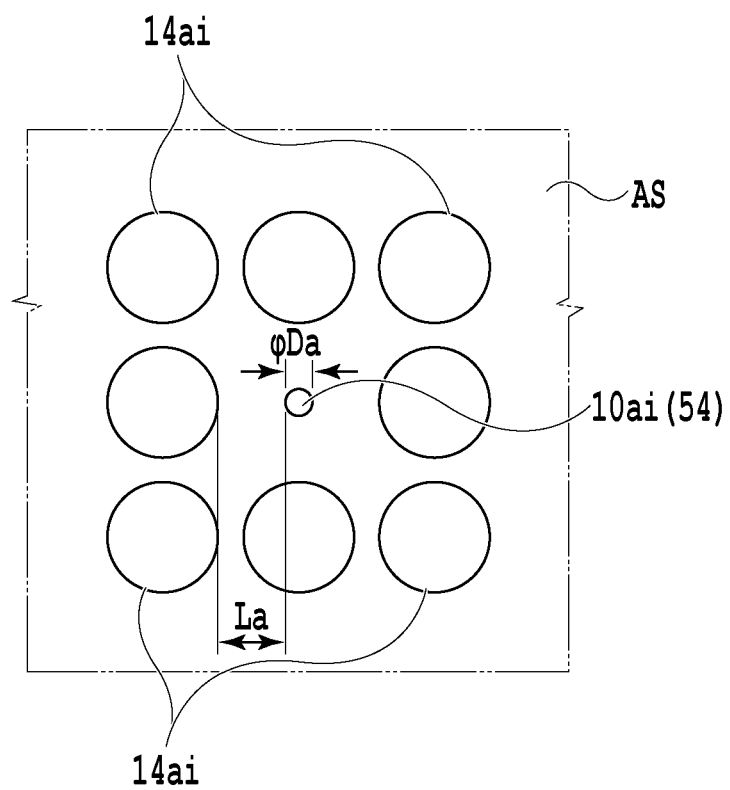
FIG. 3E is a cross-sectional view taken along the IIIE-IIIE line in FIG. 3A.
Figure 7:
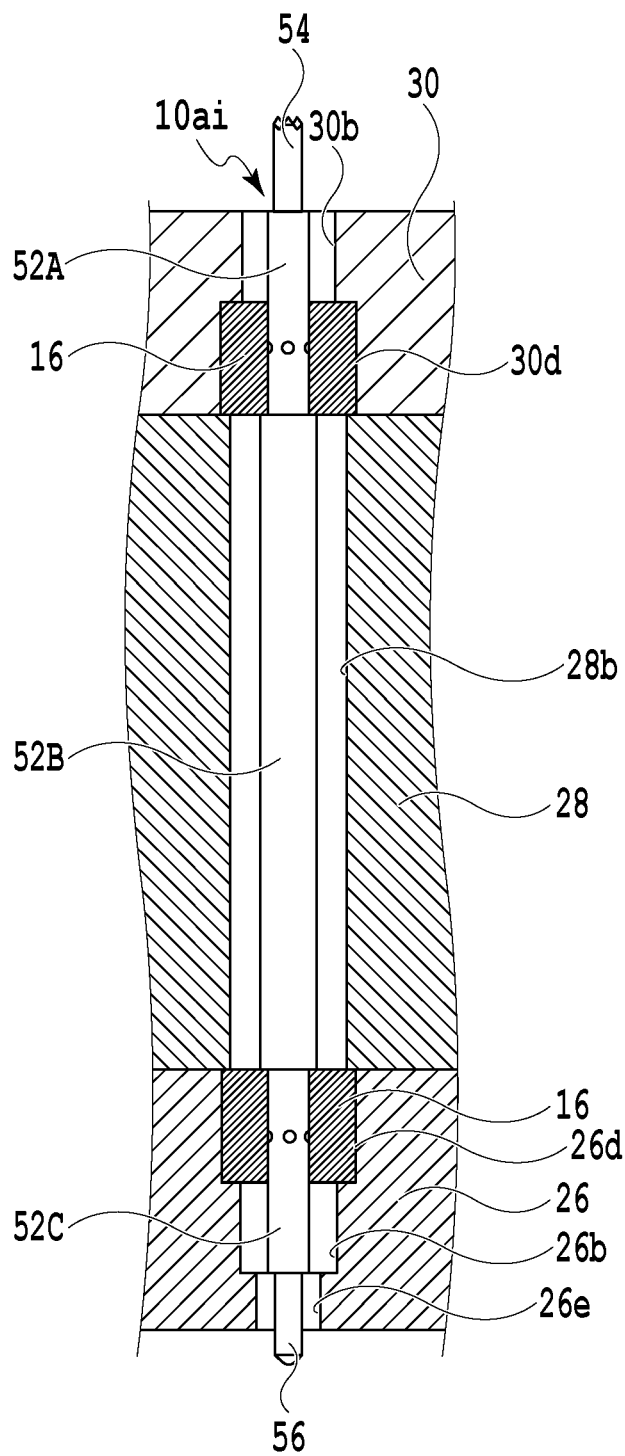
FIG. 7 is a partial cross-sectional view showing a state in which the signal line contact terminal is disposed inside the base member, an upper housing, and a lower housing.

In the above-described configuration, when signal line contact terminal 10ai is installed in the hole 28b in the upper housing 28 and the hole 26b in the lower housing 26 as shown in FIG. 7, the signal line contact terminal 10ai is first inserted into the hole 28b in the upper housing 28. Next, the collars 16 are fitted with outer peripheral portions of the first extending portion 52A and the second extending portion 52C, respectively, and then the upper housing 28 is installed each other in such a way as to be sandwiched between the base member 30 and the lower housing 26. At this time, one collar 16 out of the two collars 16 is inserted into the hole 30d in the base member 30 while the other collar 16 is inserted into the hole 26d in the lower housing 26. Hereby, as shown in FIG. 3B, air layers AS are formed between an outer peripheral portion of the drum portion 52B of the signal line contact terminal 10ai and an inner peripheral surface forming the hole 28b, between the outer peripheral portion of the first extending portion 52A and an inner peripheral surface forming the hole 30b (see FIG. 3D), between the outer peripheral portion of the second extending portion 52C and an inner peripheral surface forming the hole 26b, and between an outer peripheral portion of the plunger 56 and an inner peripheral surface forming the hole 26e. A tip end portion of the plunger 54 projects from the hole 30b in the base member 30 toward the cell, while a tip end portion of the plunger 56 projects from the hole 26e toward the printed wiring board PCB. Herewith, as shown in FIG. 3E, the tip end portion of the plunger 54 having a predetermined diameter $\phi Da$ projecting from the base member 30 is surrounded by the plurality of grounding line contact terminals 14ai via the air layers AS. Moreover, the tip end portion of the plunger 54 and each grounding line contact terminal 14ai are adjacent to each other with a predetermined relatively short distance La therebetween.

Accordingly, when the semiconductor device DV1 is mounted on the positioning plate 40 in the state where the upper housing 28 and the lower housing 26 are sandwiched and installed between the base member 30 and the printed wiring board PCB as shown in FIG. 1, any of cross sections of the base member 30, the upper housing 28, and the lower housing 26 intersecting the center axis of each signal line contact terminal 10ai in its radial direction forms a so-called coaxial probe structure set to predetermined impedance. Thus, impedance matching is achieved. At that time, the inventor of this application has confirmed that the impedance becomes the predetermined impedance near 50 ($\Omega$), for example, in terms of a common cross section including the tip end portion of the plunger 54 projecting from the base member 30 and tip end portions of the plurality of grounding line contact terminals 14ai as shown in FIG. 3E.

Figure 9A:
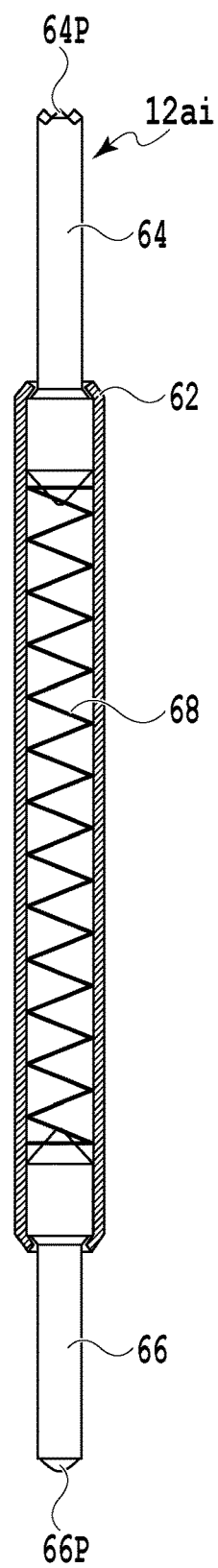
FIG. 9A is a cross-sectional view showing a power supply line contact terminal used in the example illustrated in FIG. 2A.
Figure 9B:
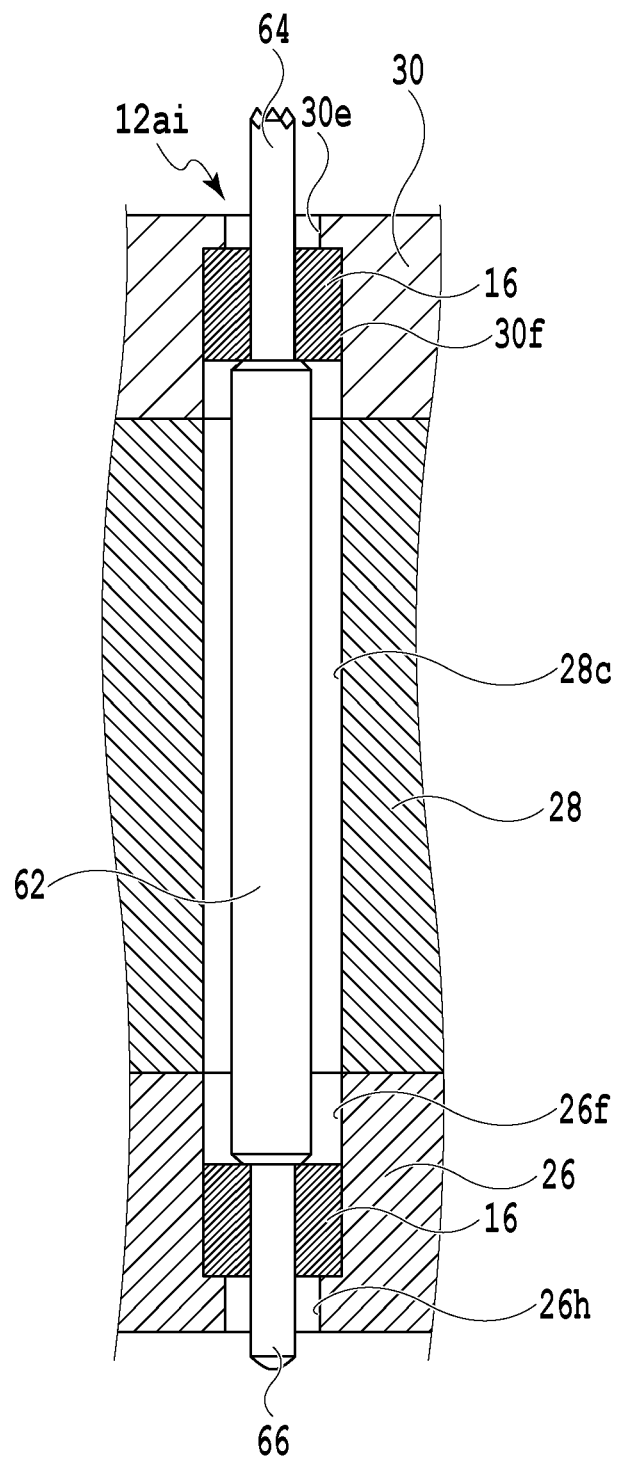
FIG. 9B is a partial cross-sectional view showing a state in which the power supply line contact terminal illustrated in FIG. 9A is disposed inside the base member, the upper housing, and the lower housing.

As shown in the enlarged view of FIGS. 9A and 9B, each power supply contact terminal 12ai (i=1 to n, n is a positive integer) includes: a plunger 64 provided with a contact portion 64P configured to selectively come into contact with the corresponding electrode portion DVa of the semiconductor device DV1; a plunger 66 provided with a contact portion 66P configured to come into contact with the corresponding contact pad on the printed wiring board PCB; and a barrel 62 accommodating a coil spring 68 to bias the plunger 64 and the plunger 66 in directions to move away from each other, and configured to connect the plunger 64 to the plunger 66 in such a way as to be capable of coming close to and moving away from each other.

The plunger 64 includes: a contact end portion made of a beryllium copper alloy, for example, and provided with the contact portion 64P formed on one end; and a spring receiving portion to receive one end of the coil spring 68. A diameter of the spring receiving portion is set larger than a diameter of the contact end portion. Part of the contact end portion of the plunger 64 projects outward from one of open end portions of the barrel 62 to be described later. A step portion formed at a boundary portion between the contact end portion and the spring receiving portion of the plunger 64 is fixed to the periphery of the open end portion of the barrel 62. Thus, a movement of the contact end portion of the plunger 64 in a direction toward the electrode portion DVa of the semiconductor device DV1 is controlled and an amount of outward projection of the contact end portion of the plunger 64 is set as appropriate.

The plunger 66 includes: a contact end portion made of a beryllium copper alloy, for example, and provided with the contact portion 66P formed on one end; and a spring receiving portion to receive another end of the coil spring 68. A diameter of the spring receiving portion is set larger than a diameter of the connecting portion. Part of the contact end portion of the plunger 66 projects outward from another open end portion of the barrel 62 to be described later. A step portion formed at a boundary portion between the contact end portion and the spring receiving portion of the plunger 66 is fixed to the periphery of the open end portion of the barrel 62. Thus, a movement of the contact end portion of the plunger 66 in a direction toward the contact pad on the printed wiring board PCB is controlled and an amount of outward projection of the contact end portion of the plunger 66 is set as appropriate.

The barrel 62 is made of phosphor bronze and formed into a cylindrical shape, for example. The barrel 62 slidably guides the plunger 64 and the plunger 66 each at a given stroke, and also accommodates the coil spring 68. A diameter of the barrel 62 is set larger than the diameter of the barrel 52 of each signal line contact terminal 10*ai* described above.

In the above-described configuration, when each power supply contact terminal 12*ai* is installed in the hole 28*c* in the upper housing 28 and the hole 26*f* in the lower housing 26 as shown in FIG. 9B, the power supply contact terminal 12*ai* is first inserted into the hole 28*c* in the upper housing 28. Next, the collars 16 are fitted on outer peripheral portions of the plungers 64 and 66, respectively, and then the upper housing 28 is installed together in such a way as to be sandwiched between the base member 30 and the lower housing 26. At this time, one collar 16 out of the two collars 16 is inserted into a hole 30*f* in the base member 30 while the other collar 16 is inserted into a hole 26*f* in the lower housing 26. In this way, air layers are formed between an outer peripheral portion of the barrel 62 of the power supply contact terminal 12*ai* and an inner peripheral surface forming the hole 28*c*, between the outer peripheral portion of the barrel 62 and an inner peripheral surface forming the hole 30*f*, between an outer peripheral portion of the plunger 64 and an inner peripheral surface forming the hole 30*e*, between the outer peripheral portion of the barrel 62 and an inner peripheral surface forming the hole 26*f*, and between an outer peripheral portion of the plunger 66 and an inner peripheral surface forming the hole 26*h*.

Figure 10A:
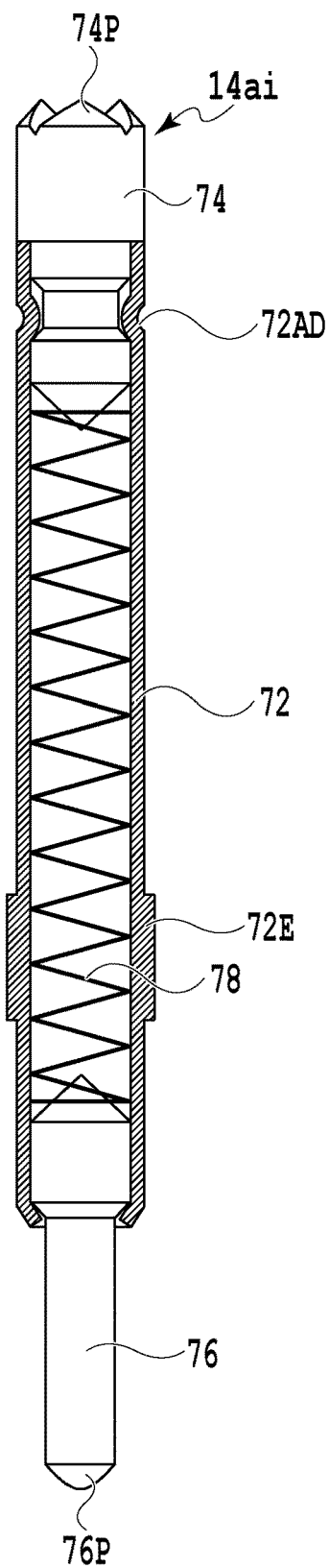
FIG. 10A is a cross-sectional view showing a grounding line contact terminal used in the example illustrated in FIG. 2A.
Figure 10B:
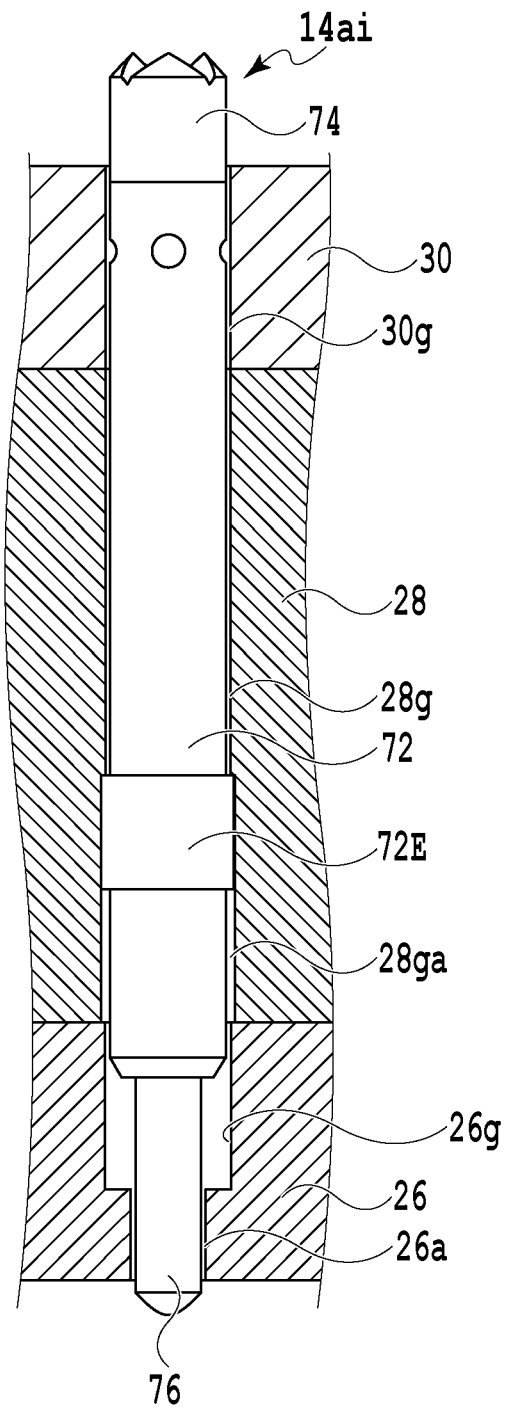
FIG. 10B is a partial cross-sectional view showing a state in which the grounding line contact terminal is disposed inside the base member, the upper housing, and the lower housing.

As shown in the enlarged view of FIGS. 10A and 10B, each grounding line contact terminal 14*ai* (i=1 to n, n is a positive integer) includes: a plunger 74 provided with a contact portion 74P configured to selectively come into contact with the corresponding electrode portion DVa of the semiconductor device DV1; a plunger 76 provided with a contact portion 76P configured to come into contact with the corresponding contact pad on the printed wiring board PCB; and a barrel 72 accommodating a coil spring 78 to bias the plunger 74 and the plunger 76 in directions to move away from each other, and configured to connect the plunger 74 to the plunger 76 in such a way as to be capable of coming close to and moving away from each other.

The plunger 74 includes: a contact end portion made of a beryllium copper alloy, for example, and provided with the contact portion 74P formed on one end; a spring receiving portion to receive one end of the coil spring 78; and a connecting portion to connect the contact end portion to the spring receiving portion. Diameters of the contact end portion and the spring receiving portion are made equal to each other, and are set larger than a diameter of the connecting portion. Part of the contact end portion of the plunger 74 projects outward from one of open end portions of the barrel 72 to be described later. A step portion formed at a boundary portion between the connecting portion and the spring receiving portion of the plunger 74 is fixed to a plurality of nibs 72AD at the barrel 72.

The plunger 76 includes: a contact end portion made of a beryllium copper alloy, for example, and provided with the contact portion 76P formed on one end; and a spring receiving portion to receive another end of the coil spring 78. A diameter of the spring receiving portion is set larger than a diameter of the contact end portion. The contact end portion of the plunger 76 projects outward from another open end portion of the barrel 72. A step portion formed at a boundary portion between the contact end portion and the spring receiving portion of the plunger 76 is fixed to the periphery of the other open end portion. Thus, a movement of the contact end portion of the plunger 76 in a direction toward the contact pad on the printed wiring board PCB is controlled and an amount of outward projection of the contact end portion of the plunger 76 is set as appropriate.

The barrel 72 is made of phosphor bronze and formed into a cylindrical shape, for example. The barrel 72 includes the plurality of nibs 72AD to fix the plunger 74, which are provided in the vicinity of the one open end portion, and a contact portion 72E formed between the plurality of nibs 72AD at an outer peripheral portion of the barrel 72 and the other open end portion. A diameter of the contact portion 72E is set larger than a diameter of the remaining portion of the barrel 72 such that the contact portion 72E comes into contact with an inner peripheral surface of the hole 28*g* in the upper housing 28.

In the above-described configuration, when each grounding line contact terminal 14*ai* is installed in the hole 28*g* in the upper housing 28 and the hole 26*g* in the lower housing 26 as shown in FIG. 10B, the grounding line contact terminal 14*ai* is first inserted into the hole 28*g* in such a way that the plunger 74 is inserted from a large-diameter portion 28*g* a side, which communicates with the hole 28*g* in the upper housing 28. Next, the upper housing 28 is installed together in such a way as to be sandwiched between the base member 30 and the lower housing 26. At this time, the plunger 74 is inserted into the hole 30*g* in the base member 30 while the plunger 76 is inserted into the holes 26*g* and a hole 26*a* in the lower housing 26. In this way, the contact portion 72E comes into contact with an inner peripheral surface of the large-diameter portion 28*ga*, and a step portion between the contact portion 72E and the remaining portion of the barrel 72 is fixed to an end of the large-diameter portion 28*ga*. Thus, a position in a direction of the center axis of the grounding line contact terminal 14*ai* is controlled. In this way, the barrel 72 is made capable of being conducted to the upper housing 28 and the lower housing 26.

Moreover, a tip end portion of the plunger 74 projects from the hole 30*g* in the base member 30 toward the cell, while a tip end portion of the plunger 76 projects from the hole 26a toward the printed wiring board PCB.

Here, in the positioning plate 40 of the above-describe example shown in FIGS. 1 to 4, the grid-like partition walls 40Pi (i=1 to n, n is a positive integer) that form the cells corresponding to the respective electrode portions DVa of the semiconductor device DV1 are formed integrally with the step portions 40S. However, the present invention is not limited to this example. For instance, the grid-like partition walls do not have to be provided as shown in FIG. 3A.

In FIG. 3A, a positioning plate 41 includes a semiconductor placing portion 41A located at a central part and configured to allow attachment and detachment of the semiconductor device DV1. The semiconductor placing portion open upward is formed by being surrounded by inclined surface portions on four sides that guide the semiconductor device DV1 at the time of attachment. Step portions 41S are formed at bases of the respective inclined surface portions so as to catch edges around the electrode group at the package of the semiconductor device DV1. Although illustration is omitted, two sides of each step portion 41S along each side of the package of the semiconductor device DV1 are connected to ends of the adjacent step portions 41S, respectively. Two ends of each step portion 41S are provided with recesses corresponding to the corner portions of the package of the semiconductor device DV1 to be attached. The opening 41C is formed between the step portions 41S opposed to each other.

Here, a diameter of the contact portion 54P of the contact end portion at the plunger 54 of each signal line contact terminal 10ai described above is set equal to a diameter of the remaining portion of the contact end portion and smaller than the diameter of the first extending portion 52A of the barrel 52. However, the present invention is not limited to this example. For instance, in each signal line contact terminal 10ai, a diameter φDb of a contact portion 54'P of a contact end portion of a plunger 54' serving as the first plunger may be set larger than diameters φDc of the remaining portions of the contact end portion and substantially equal to the diameter of the first extending portion 52A of the barrel 52 as shown in FIGS. 5B and 5D.

Figure 5B:
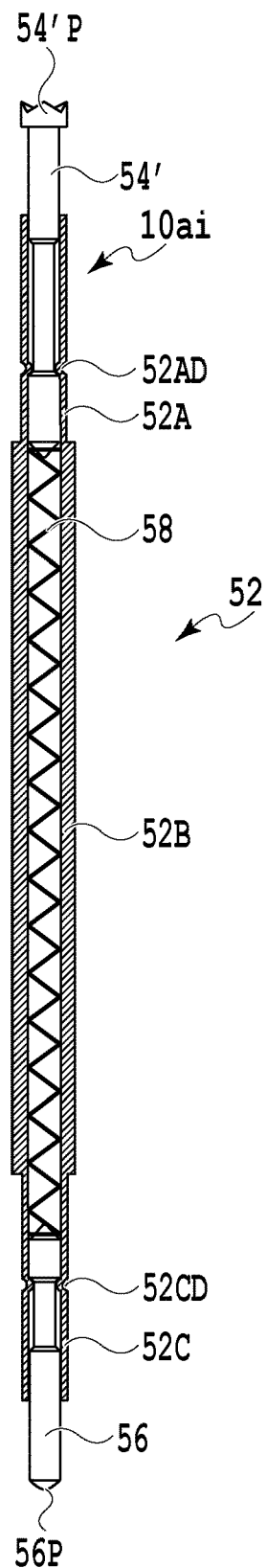
FIG. 5B is a cross-sectional view showing another example of the signal line contact terminal used in the example illustrated in FIG. 2A.
Figure 5C:
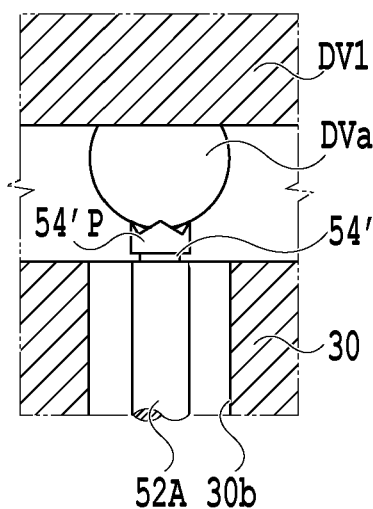
FIG. 5C is a partial cross-sectional view showing in a partial enlarged the signal line contact terminal illustrated in FIG. 5B in a state of being disposed inside the base member together with an electrode portion of the semiconductor device.
Figure 5D:
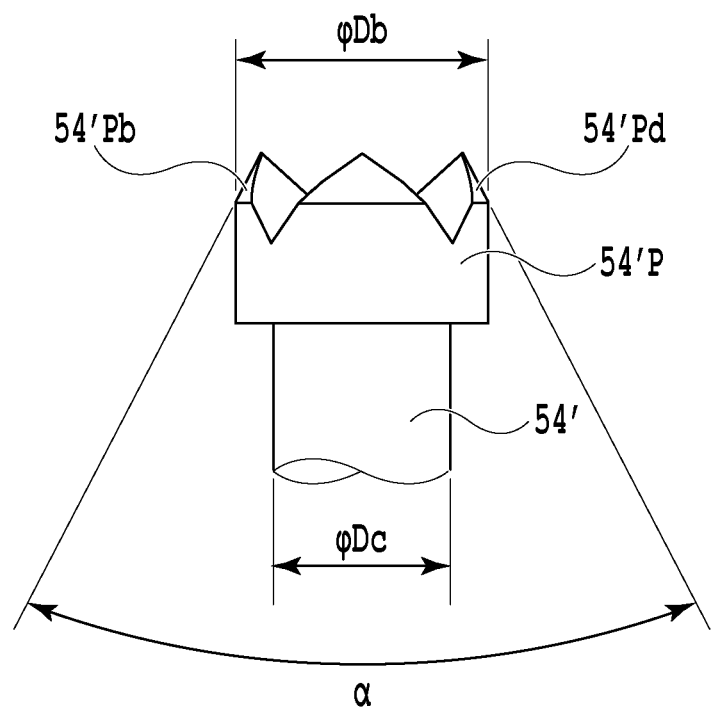
FIG. 5D is a partial enlarged view showing an enlarged part of a plunger of the signal line contact illustrated in FIG. 5C.

Note that constituents in FIGS. 5B and 5C which are the same as the constituents in the example shown in FIG. 5A will be denoted by the same reference signs and overlapping explanations thereof will be omitted.

In FIG. 5B, each signal line contact terminal 10ai includes: the plunger 54' provided with the contact portion 54'P configured to selectively come into contact with the corresponding electrode portion DVa of the semiconductor device DV1; the plunger 56 provided with the contact portion 56P configured to come into contact with the corresponding contact pad on the printed wiring board PCB; and the barrel 52 accommodating the coil spring 58 serving as the elastic member to bias the plunger 54' and the plunger 56 in directions to move away from each other, and configured to connect the plunger 54' to the plunger 56 in such a way as to be capable of coming close to and moving away from each other.

Figure 5E:
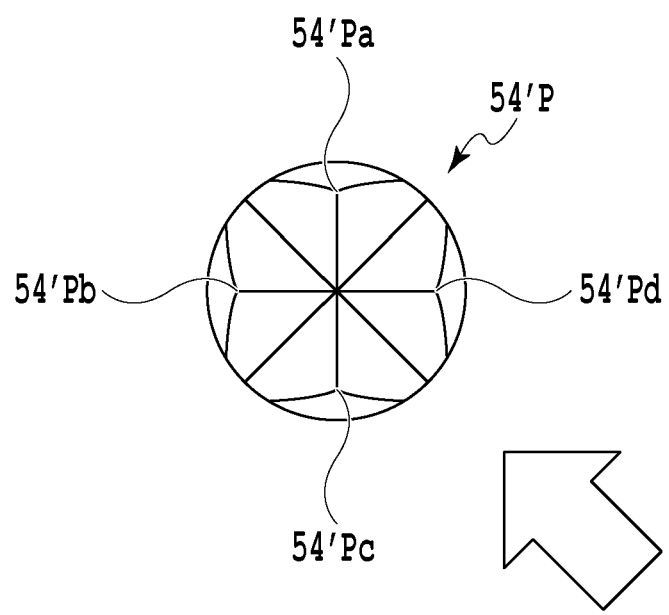
FIG. 5E is a top plan view of FIG. 5D.
Figure 5F:
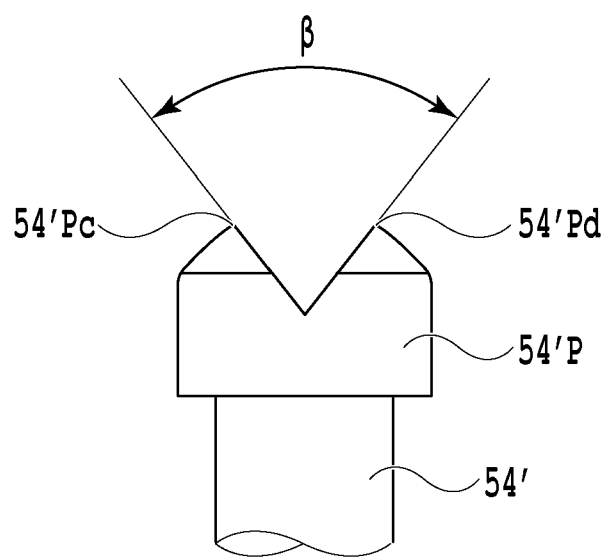
FIG. 5F is a view on arrow from a direction indicated with an arrow in FIG. 5E.

The plunger 54' includes: a contact end portion made of a beryllium copper alloy, for example, and provided only with the contact portion 54'P formed in an enlarged manner on one end; the spring receiving portion to receive one end of the coil spring 58; and the connecting portion to connect the contact end portion to the spring receiving portion. As shown in FIGS. 5B and 5D, the diameters φDc of a portion of the contact end portion other than the contact portion 54'P and of the spring receiving portion are made equal to each other, and are set larger than a diameter of the connecting portion. As shown in the enlarged view of FIGS. 5D and 5E, the contact portion 54'P having a very small diameter φDb that is a diameter larger than the diameters φDb includes pointed contact portions 54'Pa, 54'Pb, 54'Pc, and 54'Pd that come into contact with the electrode portion DVa of the semiconductor device DV1. As shown in the enlarged view of FIG. 5E, the contact portions 54'Pa, 54'Pa, 54'Pc, and 54'Pd are formed along a circumferential direction at intervals of about 90°. As shown in FIG. 5F, inclined surface portions of the respective contact portions that are adjacent along the circumferential direction intersect with each other while forming a predetermined angle β. Moreover, as shown in FIG. 5D, generatrices of a conical surface, which are formed in cooperation with the contact portions 54'Pb and the 54 'Pd as well as the contact portions 54 'Pa and 54'Pc opposed to each other, intersect with each other while forming a predetermined angle α.

Part of the contact end portion of the plunger 54' projects outward from the end portion of the cylindrical first extending portion 52A of the barrel 52. A step portion formed at a boundary portion between the connecting portion and the spring receiving portion of the plunger 54' is fixed to the plurality of nibs 52AD at the first extending portion 52A. Thus, a movement of the contact end portion of the plunger 54' in a direction toward the electrode portion DVa of the semiconductor device DV1 is controlled and an amount of outward projection of the contact end portion of the plunger 54' is set as appropriate.

In the above-described configuration, the diameter φDb of the contact portion 54'P of the plunger 54' is set larger than the diameter of the contact portion 54P of the plunger 54 shown in FIG. 5A. Accordingly, the contact portions 54'Pa, 54'Pb, 54'Pc, and 54'Pd of the contact portion 54'P come into contact with a substantially semispherical outer peripheral surface of the electrode portion DVa of the semiconductor device DV1 with a larger contact area. In this way, the contact portion 54'P of the plunger 54' comes into contact in a more stable state with the substantially semispherical outer peripheral surface of the electrode portion DVa of the semiconductor device DV1. As a consequence, a transmission characteristic of a signal line is more stabilized as well.

Moreover, in the example shown in FIGS. 3A and 3E, for instance, the positioning plate 41 is provided with the opening 41C at the tip end portion of the contact portion 54P of the plunger 54 in the signal line contact terminal 10ai. Accordingly, the air layer AS is interposed between the signal line contact terminal 10ai and each grounding line contact terminal 14ai. For this reason, the impedance at the cross section crossing the contact portion 54P and the opening 41C of the positioning plate 41 tends to become locally higher than a predetermined impedance value (such as 50 Ω). In this case, when the tip end portion φDb (see FIG. 5D) of the plunger 54' has the larger diameter than that of the tip end portion φDa (see FIG. 3E) of the plunger 54, the tip end portion 54'P of the plunger 54' is located adjacent to the plunger 74 of the grounding line contact terminal 14ai with the shorter distance La therebetween. Accordingly, this configuration exerts an effect to bring the impedance at the cross section crossing the opening 41C closer to the predetermined impedance.

Figure 19A:
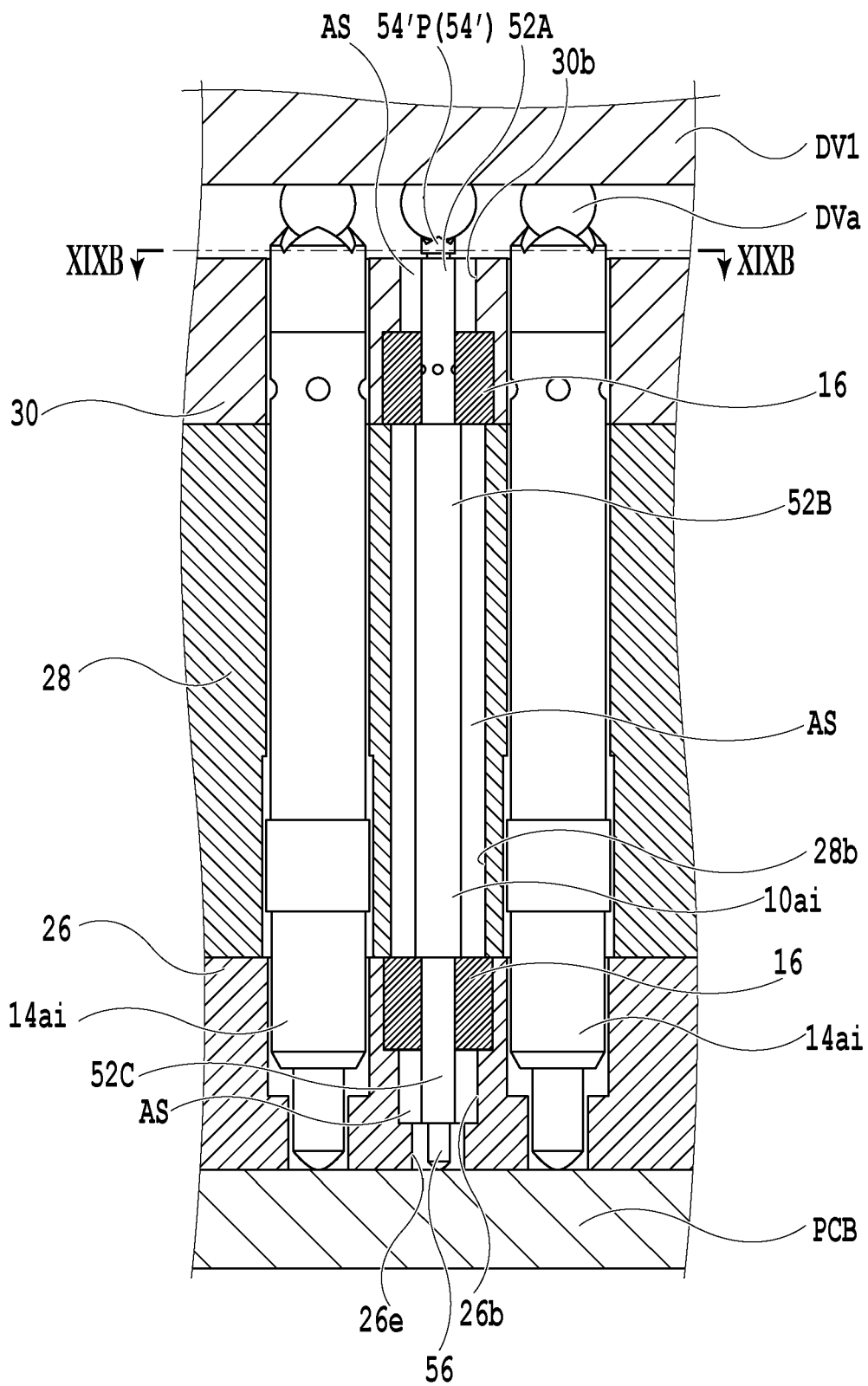
FIG. 19A is a partial cross-sectional view showing an enlarged main part of an example of applying the signal line contact terminal illustrated in FIG. 5B to the IC socket illustrated in FIG. 3A.

Moreover, as shown in FIG. 19A, the signal line contact terminal 10ai having the above-described plunger 54' maybe used in the aforementioned example shown in FIG. 3A. Note that constituents in FIGS. 19A and 19B which are the same as the constituents in FIGS. 3A and 3E will be denoted by the same reference signs and overlapping explanations thereof will be omitted.

Figure 19B:
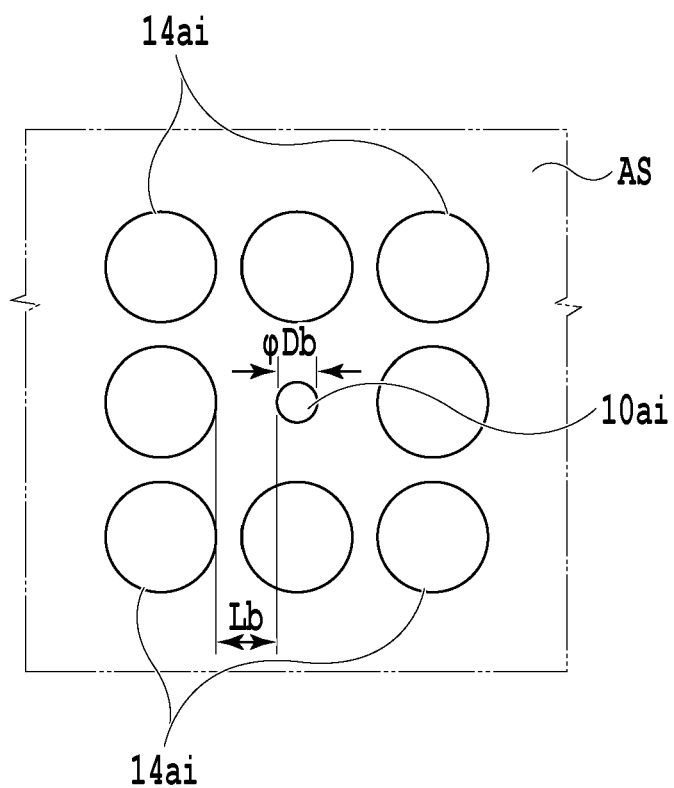
FIG. 19B is a cross-sectional view taken along the XIXB-XIXB line in FIG. 19A.

In the above-described configuration, when each signal line contact terminal 10*ai* is installed in the hole 28*b* in the upper housing 28 and the hole 26*b* in the lower housing 26 as shown in FIG. 19A, the signal line contact terminal 10*ai* is first inserted into the hole 28*b* in the upper housing 28. Next, the collars 16 are fitted on the outer peripheral portions of the first extending portion 52A and the second extending portion 52C, respectively, and then the upper housing 28 is installed together in such a way as to be sandwiched between the base member 30 and the lower housing 26. As shown in FIG. 19B, the signal line contact terminal 10*ai* is disposed between the grounding line contact terminals 14*ai* that are adjacent to each other. At this time, one collar 16 out of the two collars 16 is inserted into the hole 30*d* in the base member 30 while the other collar 16 is inserted into the hole 26*d* in the lower housing 26. In this way, as shown in FIG. 19B, air layers AS are formed between the outer peripheral portion of the drum portion 52B of the signal line contact terminal 10*ai* and the inner peripheral surface forming the hole 28*b*, between the outer peripheral portion of the first extending portion 52A and the inner peripheral surface forming the hole 30*b* (see FIG. 19A), between the outer peripheral portion of the second extending portion 52C and the inner peripheral surface forming the hole 26*b*, and between the outer peripheral portion of the plunger 56 and the inner peripheral surface forming the hole 26*e*. A tip end portion of the plunger 54' projects from the hole 30*b* in the base member 30 toward the cell, while the tip end portion of the plunger 56 projects from the hole 26*e* toward the printed wiring board PCB. Thus, as shown in FIG. 19B, the tip end portion of the plunger 54' having the predetermined diameter $\phi$Db and projecting from the base member 30 is surrounded by the plurality of grounding line contact terminals 14*ai* via the air layers AS. At the same time, the tip end portion of the plunger 54' and each grounding line contact terminal 14*ai* are adjacent to each other with a predetermined relatively short distance Lb therebetween. Since the diameter $\phi$Db of the tip end portion of the plunger 54' has a larger value than the diameter $\phi$Da of the plunger 54, the distance Lb becomes smaller than the distance La in FIG. 3E, and the tip end portion of the plunger 54' and each grounding line contact terminal 14*ai* come closer to each other.

Accordingly, when the semiconductor device DV1 is mounted on the positioning plate 40 in the state where the upper housing 28 and the lower housing 26 are sandwiched and installed between the base member 30 and the printed wiring board PCB as shown in FIG. 19A, any of cross sections of the base member 30, the upper housing 28, and the lower housing 26 intersecting the center axis of each signal line contact terminal 10*ai* in its radial direction forms the so-called coaxial probe structure set to the predetermined impedance. Thus, the impedance matching is achieved. At that time, the inventor of this application has confirmed that the impedance becomes the predetermined impedance near 50 ($\Omega$), for example, in terms of a common cross section including the tip end portion of the plunger 54' projecting from the base member 30 and the tip end portions of the plurality of grounding line contact terminals 14*ai*.

Figure 20A:
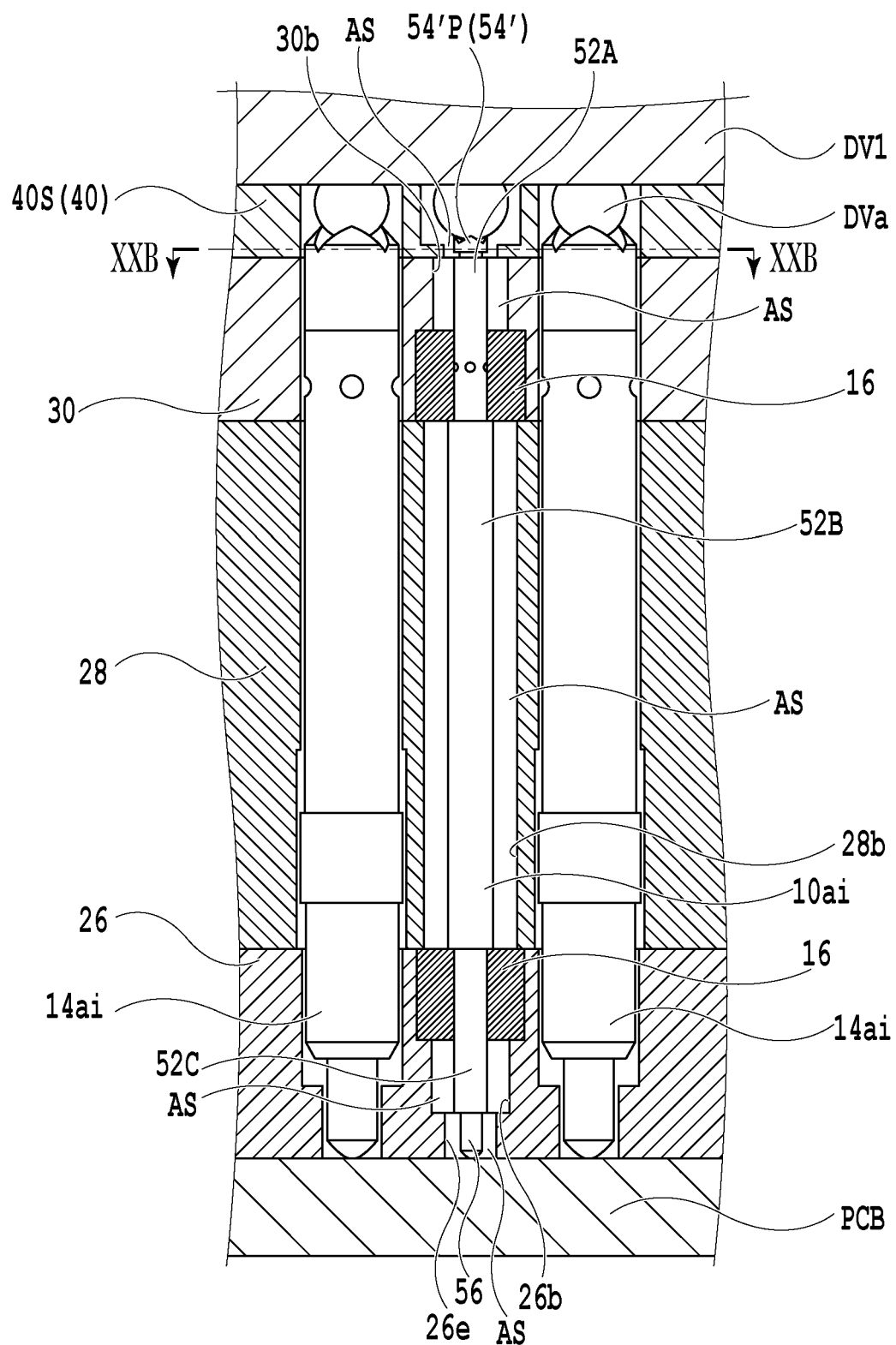
FIG. 20A is a partial cross-sectional view showing an enlarged main part of an example of applying the signal line contact terminal illustrated in FIG. 5B to the IC socket illustrated in FIG. 4.

Furthermore, as shown in FIG. 20A, the signal line contact terminal 10*ai* having the above-described plunger 54' maybe used in the aforementioned example shown in FIG. 1. Note that constituents in FIGS. 26A to 26E which are the same as the constituents in FIGS. 1 will be denoted by the same reference signs and overlapping explanations thereof will be omitted.

Figure 20B:
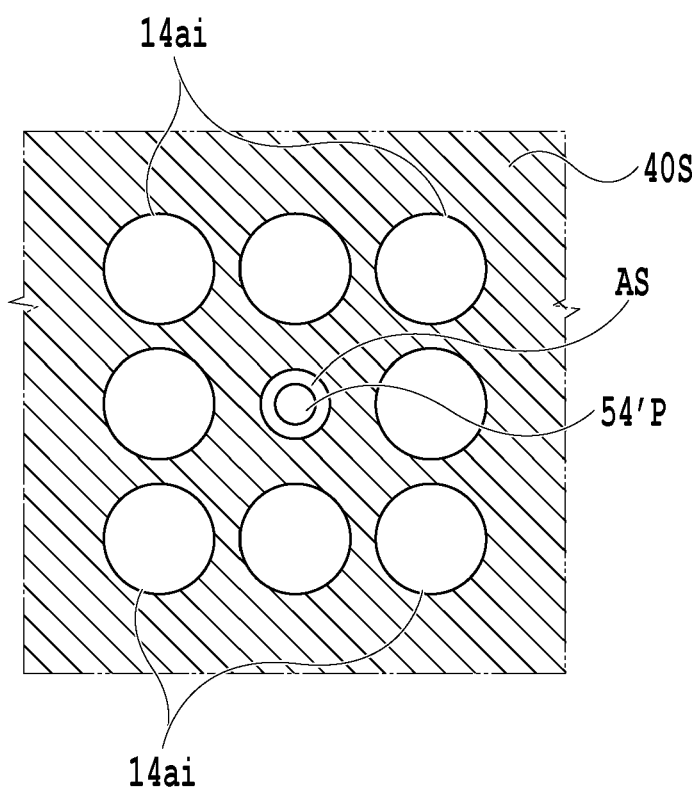
FIG. 20B is a cross-sectional view taken along the XXB-XXB line in FIG. 20A.

In the above-described configuration, when each signal line contact terminal 10*ai* is installed in the hole 28*b* in the upper housing 28 and the hole 26*b* in the lower housing 26 as shown in FIG. 20A, the signal line contact terminal 10*ai* is first inserted into the hole 28*b* in the upper housing 28. Next, the collars 16 are fitted on the outer peripheral portions of the first extending portion 52A and the second extending portion 52C, respectively, and then the upper housing 28 is installed together in such a way as to be sandwiched between the base member 30 as well as the step portion 40S of the positioning plate 40 and the lower housing 26. As shown in FIG. 20B, the signal line contact terminal 10*ai* is disposed between the grounding line contact terminals 14*ai* that are adjacent to each other. At this time, one collar 16 out of the two collars 16 is inserted into the hole 30*d* in the base member 30 while the other collar 16 is inserted into the hole 26*d* in the lower housing 26. In this way, as shown in FIG. 20A, air layers AS are formed between the outer peripheral portion of the drum portion 52B of the signal line contact terminal 10*ai* and the inner peripheral surface forming the hole 28*b*, between the outer peripheral portion of the first extending portion 52A and the inner peripheral surface forming the hole 30*b*, between the outer peripheral portion of the second extending portion 52C and the inner peripheral surface forming the hole 26*b*, and between the outer peripheral portion of the plunger 56 and the inner peripheral surface forming the hole 26*e*. The tip end portion of the plunger 54' projects from the hole 30*b* in the base member 30 toward the cell, while the tip end portion of the plunger 56 projects from the hole 26*e* toward the printed wiring board PCB. Thus, as shown in FIG. 20B, the tip end portion of the plunger 54' having the predetermined diameter $\phi$Db and projecting from the base member 30 is surrounded by the plurality of grounding line contact terminals 14*ai* via the air layers AS and the positioning plate 40 (the step portions 40S).

Accordingly, when the semiconductor device DV1 is mounted on the positioning plate 40 in the state where the upper housing 28 and the lower housing 26 are sandwiched and installed between the base member 30 and the printed wiring board PCB as shown in FIG. 20A, any of the cross sections of the base member 30, the upper housing 28, and the lower housing 26 intersecting the center axis of each signal line contact terminal 10*ai* in its radial direction forms the so-called coaxial probe structure set to the predetermined impedance. Thus, the impedance matching is achieved. At that time, the inventor of this application has confirmed that the impedance becomes the predetermined impedance near 50 ($\Omega$), for example, in terms of the common cross section including the tip end portion of the plunger 54' projecting from the base member 30 and the tip end portions of the plurality of grounding line contact terminals 14*ai*.

Figure 5G:
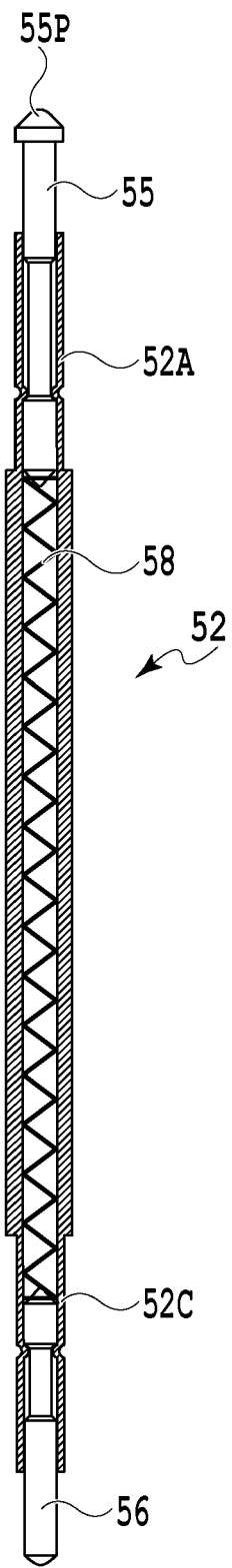
FIG. 5G is a cross-sectional view showing still another example of the signal line contact terminal used in the example illustrated in FIG. 2A.

The tip end portion of the plunger 54' in the signal line contact terminal 10*ai* shown in FIG. 5C is configured to come into contact with the substantially semispherical electrode portion DVa of the semiconductor device DV1. However, when a semiconductor device of an LGA type is attached instead of the semiconductor device of the BGA type, for example, a signal line contact terminal as shown in FIG. 5G may be used instead. Note that constituents in FIG. 5G which are the same as the constituents in the example shown in FIG. 5B will be denoted by the same reference signs and overlapping explanations thereof will be omitted.

The signal line contact terminal includes a plunger 55 provided with a contact portion 55P configured to selectively come into contact with a flat electrode portion (not shown) of the semiconductor device; the plunger 56 provided with the contact portion 56P configured to come into contact with the corresponding contact pad on the printed wiring board PCB; and the barrel 52 accommodating the coil spring 58 serving as the elastic member to bias the plunger 55 and the plunger 56 in directions to move away from each other, and configured to connect the plunger 55 to the plunger 56 in such a way as to be capable of coming close to and moving away from each other.

Figure 5H:
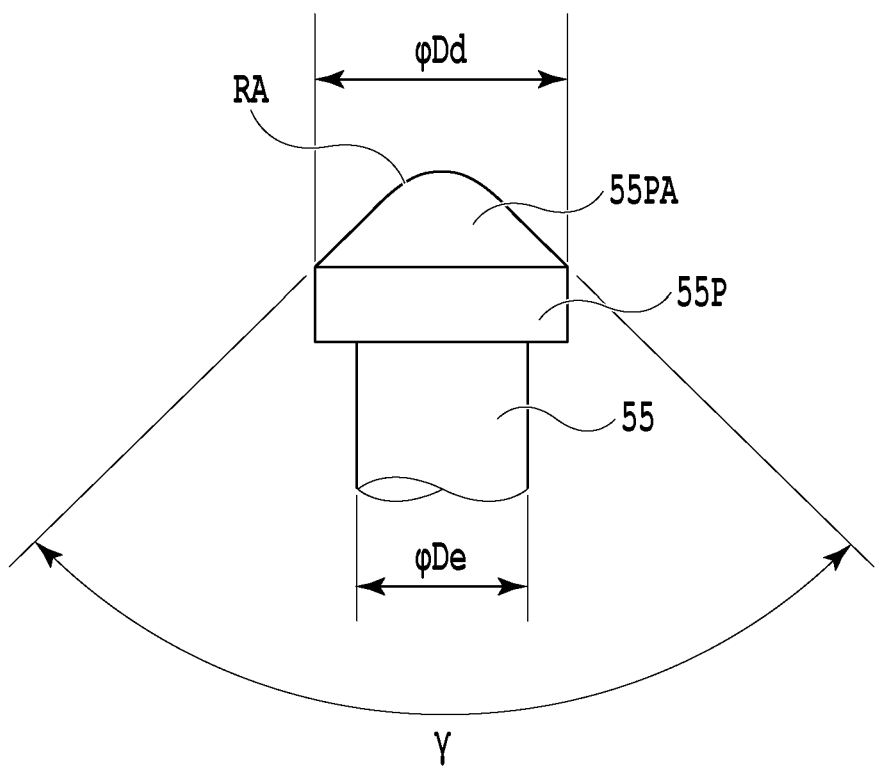
FIG. 5H is a partial enlarged view showing an enlarged part of a plunger of the signal line contact illustrated in FIG. 5G.

The plunger 55 includes: a contact end portion made of a beryllium copper alloy, for example, and provided only with the contact portion 55P of a conical shape formed in an enlarged manner on one end; the spring receiving portion to receive one end of the coil spring 58; and the connecting portion to connect the contact end portion to the spring receiving portion. As shown in FIG. 5G, diameters φDe of a portion of the contact end portion other than the contact portion 55P and of the spring receiving portion are made equal to each other, and are set larger than a diameter of the connecting portion. As shown in the enlarged view of FIG. 5H, in the contact portion 55P having a very small diameter φDd that is a diameter larger than the diameters φDe, the conical contact portion that comes into contact with the electrode portion of the semiconductor device has an apex having a predetermined radius RA and a predetermined conical angle γ.

Part of the contact end portion of the plunger 55 projects outward from the end portion of the cylindrical first extending portion 52A of the barrel 52. A step portion formed at a boundary portion between the connecting portion and the spring receiving portion of the plunger 55 is fixed to the plurality of nibs 52AD at the first extending portion 52A. Thus, a movement of the contact end portion of the plunger 55 in a direction toward the electrode portion of the semiconductor device is controlled and an amount of outward projection of the contact end portion of the plunger 55 is set as appropriate.

In the above-described configuration, the diameter φDd of the contact portion 55P of the plunger 55 is set larger than the diameter of the contact portion 54P of the plunger 54 shown in FIG. 5A. Accordingly, the tip end portion of the plunger 55 and each grounding line contact terminal 14*ai* adjacent thereto come closer to each other.

Furthermore, the barrel 52 of the signal line contact terminal 10*ai* described above is provided with the second extending portion 52C. However, the present invention is not limited only to this example. For instance, as shown in the enlarged view of FIG. 8A, a barrel 52' of a signal line contact terminal 10'*ai* may be configured not to include any second extending portion. Note that constituents in FIGS. 8A and 8B which are the same as the constituents in the example shown in FIG. 5A will be denoted by the same reference signs and overlapping explanations thereof will be omitted.

Figure 8A:
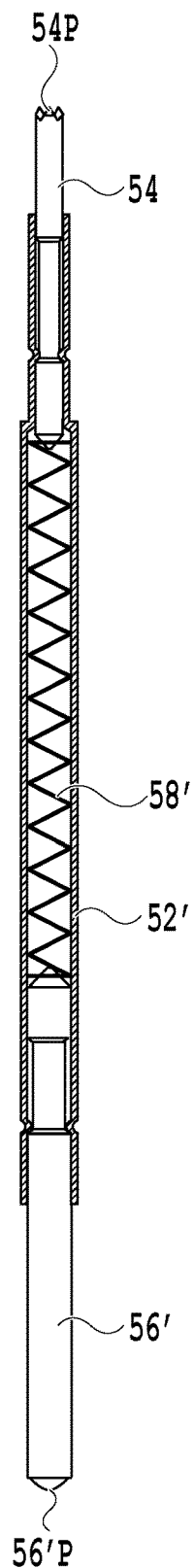
FIG. 8A is a cross-sectional view showing still another example of the signal line contact terminal used in the example illustrated in FIG. 2A.
Figure 8B:
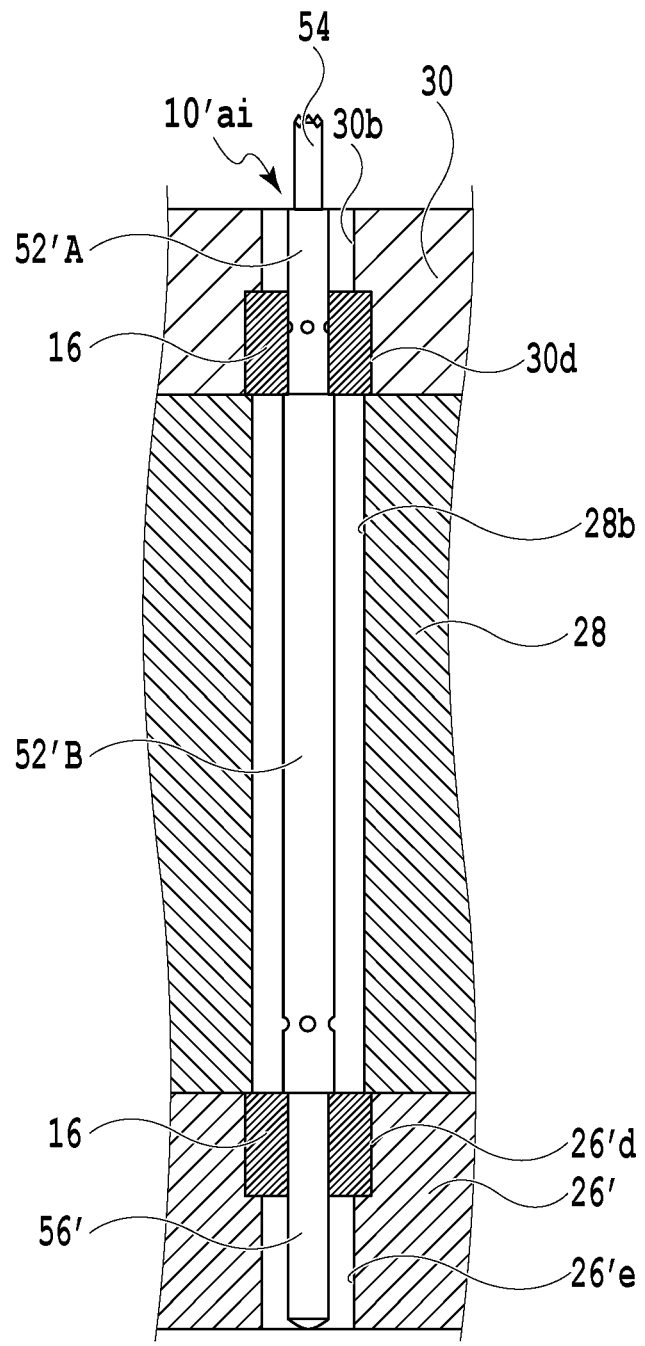
FIG. 8B is a partial cross-sectional view showing a state in which the signal line contact terminal illustrated in FIG. 8A is disposed inside the base member, the upper housing, and the lower housing.

As shown in the enlarged view of FIGS. 8A and 8B, each signal line contact terminal 10'*ai* includes: the plunger 54 provided with the contact portion 54P configured to selectively come into contact with the corresponding electrode portion DVa of the semiconductor device DV1; a plunger 56' provided with a contact portion 56'P configured to come into contact with the corresponding contact pad on the printed wiring board PCB; and the barrel 52 accommodating the coil spring 58 to bias the plunger 54 and the plunger 56' in directions to move away from each other, and configured to connect the plunger 54 to the plunger 56' in such a way as to be capable of coming close to and moving away from each other.

The plunger 56' includes: a contact end portion made of a beryllium copper alloy, for example, and provided with the contact portion 56'P formed on one end; the spring receiving portion to receive the other end of the coil spring 58; and the connecting portion to connect the contact end portion to the spring receiving portion. Diameters of the contact end portion and the spring receiving portion are made equal to each other, and are set larger than a diameter of the connecting portion. Part of a contact end portion of the plunger 56' projects outward from an open end portion of the barrel 52' to be described later. A step portion formed at a boundary portion between the connecting portion and the contact end portion of the plunger 56' is fixed to a plurality of nibs 52'BD. Thus, a movement of the contact end portion of the plunger 56' in a direction toward the coil spring 58 is controlled.

The barrel 52' is made of phosphor bronze and formed into a cylindrical shape, for example. The barrel 52' includes an extending portion 52'A which slidably guides the plunger 54 at a given stroke, and a drum portion 52'B connected to the extending portion 52'A. The drum portion 52'B is formed integrally with the extending portion 52'A. A diameter of the drum portion 52'B is set larger than a diameter of the extending portion 52'A.

In the above-described configuration, when each signal line contact terminal 10'*ai* is installed in the hole 28*b* in the upper housing 28 and a hole 26'*e* in a lower housing 26' as shown in FIG. 8B, the signal line contact terminal 10'*ai* is first inserted into the hole 28*b* in the upper housing 28. Next, the collars 16 are fitted on outer peripheral portions of the extending portion 52'A and of the contact end portion of the plunger 56', respectively, and then the upper housing 28 is installed together in such a way as to be sandwiched between the base member 30 and the lower housing 26'. At this time, one collar 16 out of the two collars 16 is inserted into the hole 30*d* in the base member 30 while the other collar 16 is inserted into a hole 26'*d* in the lower housing 26'. In this way, air layers are formed between an outer peripheral portion of the drum portion 52'B of the signal line contact terminal 10'*ai* and the inner peripheral surface forming the hole 28*b*, between an outer peripheral portion of the extending portion 52'A and the inner peripheral surface forming the hole 30*b*, and between an outer peripheral portion of the contact end portion of the plunger 56' and an inner peripheral surface forming the hole 26'*e*. The tip end portion of the plunger 54 projects from the hole 30*c* in the base member 30 toward the cell, while an end surface of a tip end portion of the plunger 56 is located on a plane flush with the periphery of an open end of the hole 26'*e*.

Accordingly, in this example as well, when the semiconductor device DV1 is mounted on the positioning plate 40 in the state where the upper housing 28 and the lower housing 26' are sandwiched and installed between the base member 30 and the printed wiring board PCB, any of cross sections of the base member 30, the upper housing 28, and the lower housing 26' intersecting each signal line contact terminal 10'*ai* forms the so-called coaxial probe structure set to the predetermined impedance. Thus, the impedance matching is achieved.

Figure 11:
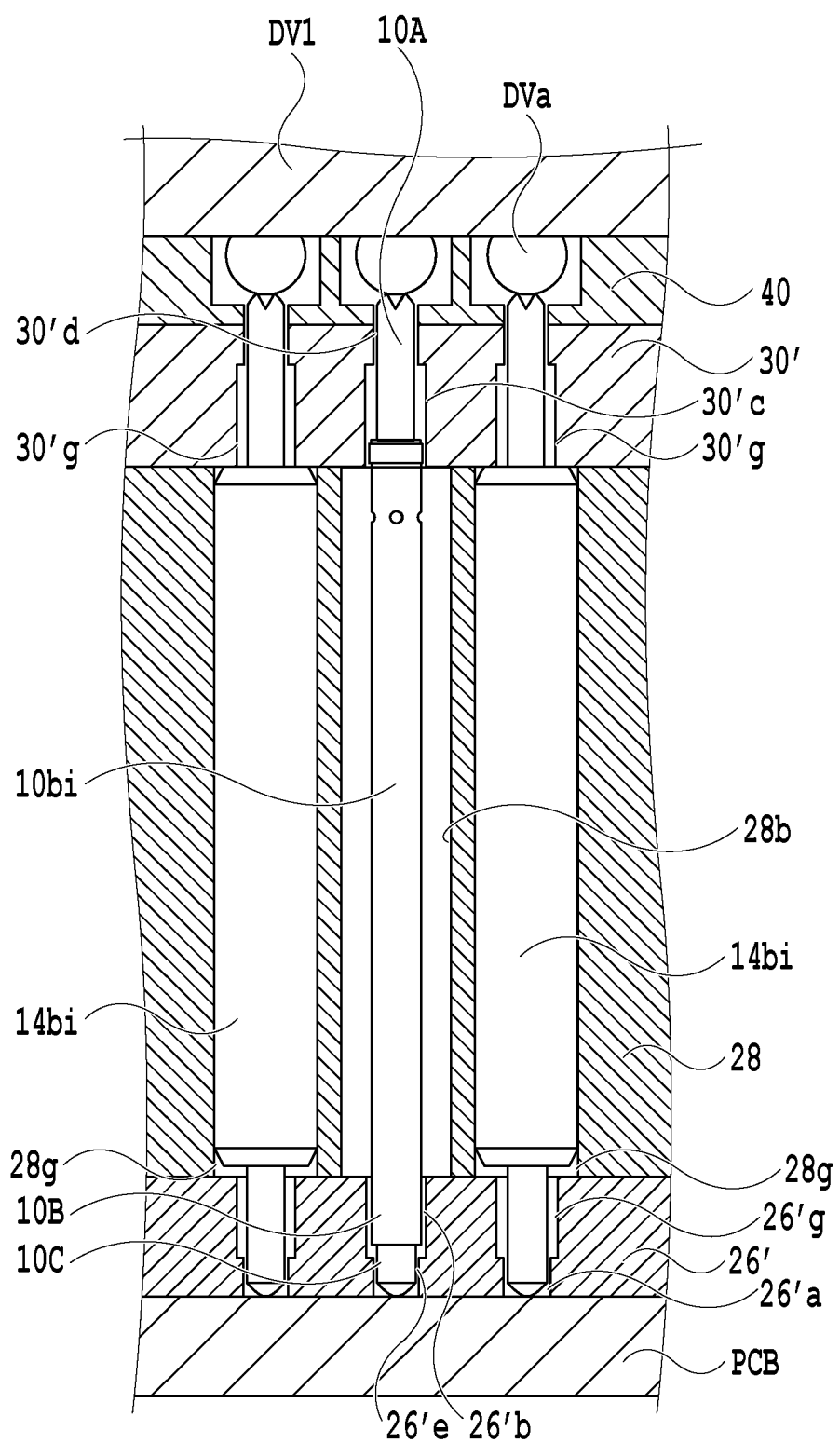
FIG. 11 is a partial cross-sectional view showing an enlarged configuration of a main part of a comparative example.

The inventor of this application has verified variations in peaks of reflection losses (return losses) and insertion losses in first embodiment of the IC socket according to the present invention the above-described and in an IC socket of a comparative example shown in FIG. 11, by a predetermined simulator in a virtual model where the semiconductor device is connected to the printed wiring board PCB.

The IC socket of the comparative example shown in FIG. 11 includes a pressing mechanism unit which is similar to the pressing mechanism unit of the clam shell type shown in FIG. 2A, the upper housing 28, the lower housing 26', and a contact terminal group to be provided inside the upper housing 28 and the lower housing 26'. The upper housing 28 is sandwiched between a base member 30' made of a resin and the lower housing 26' made of a resin.

The contact terminal group includes a plurality of signal line contact terminals 10*bi* (i=1 to n, n is a positive integer), a plurality of grounding line contact terminals 14*bi* (i=1 to n, n is a positive integer), and a plurality of power supply line contact terminals (not shown). Each signal line contact terminal 10*bi* is disposed between the grounding line contact terminals 14*bi* which are adjacent to each other in the upper housing 28 and the lower housing 26'.

Note that constituents in FIG. 11 which are the same as the constituents in the example shown in FIG. 2A will be denoted by the same reference signs and overlapping explanations thereof will be omitted.

Each signal line contact terminal 10*bi* includes: a plunger 10A provided with a contact portion configured to selectively come into contact with the corresponding electrode portion DVa of the semiconductor device DV1; a plunger 10C provided with a contact portion configured to come into contact with the corresponding contact pad on the printed wiring board PCB; and a barrel 10B accommodating a coil spring (not shown) to bias the plunger 10A and the plunger 10C in directions to move away from each other, and configured to connect the plunger 10A to the plunger 10C in such a way as to be capable of coming close to and moving away from each other.

When each signal line contact terminal 10*bi* is installed in the hole 28*b* in the upper housing 28 and a hole 26'*b* in the lower housing 26', the signal line contact terminal 10*bi* is first inserted into the hole 28*b* in the upper housing 28. Next, the upper housing 28 is installed together in such a way as to be sandwiched between the base member 30' and the lower housing 26'. At this time, the plunger 10A is inserted into holes 30'*d* and 30'*c* in the base member 30' while the plunger 10C is inserted into the holes 26'*b* and 26'*e* in the lower housing 26'. In this way, air layers are formed between an outer peripheral portion of the barrel 10B of the signal line contact terminal 10*bi* and the inner peripheral surface forming the hole 28*b*, between an outer peripheral portion of the plunger 10A and inner peripheral surfaces forming the holes 30'*c* and 30'*d*, between the plunger 10C and an inner peripheral surface forming the hole 26'*b*, and between an outer peripheral portion of the plunger 10C and the inner peripheral surface forming the hole 26*e*.

Figure 12:
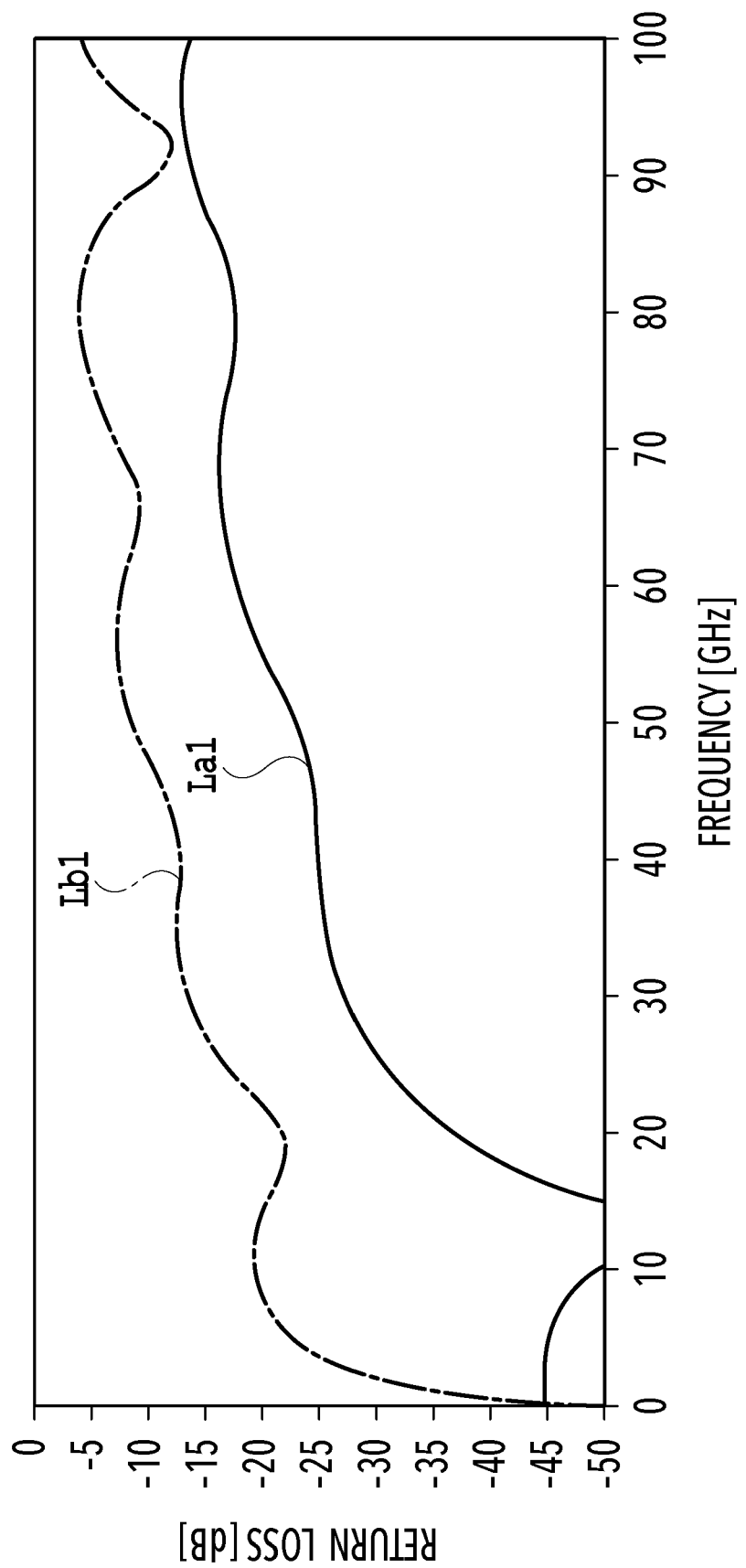
FIG. 12 is a characteristic diagram representing characteristic lines of return losses of the first embodiment of the IC socket according to the present invention and an IC socket of the comparative example.

In FIG. 12, the vertical axis indicates peak values (dB) of the reflection losses (return losses) and the horizontal axis indicates frequencies (GHz). FIG. 12 depicts a characteristic line Lb1 that represents a variation in peak value of the return loss in the comparative example obtained by a prescribed simulator, and a characteristic line La1 that represents a variation in peak value of the return loss of the first embodiment of the IC socket according to the present invention obtained by the prescribed simulator.

As apparent from the characteristic line La1 in FIG. 12, in the first embodiment of the IC socket according to the present invention, no ripples are observed in a range from about 60 to 90 GHz, for example, as compared to the characteristic line Lb1. In addition, the characteristic line La1 shows an improvement in the return loss which is equal to or below −15 dB.

Figure 13:
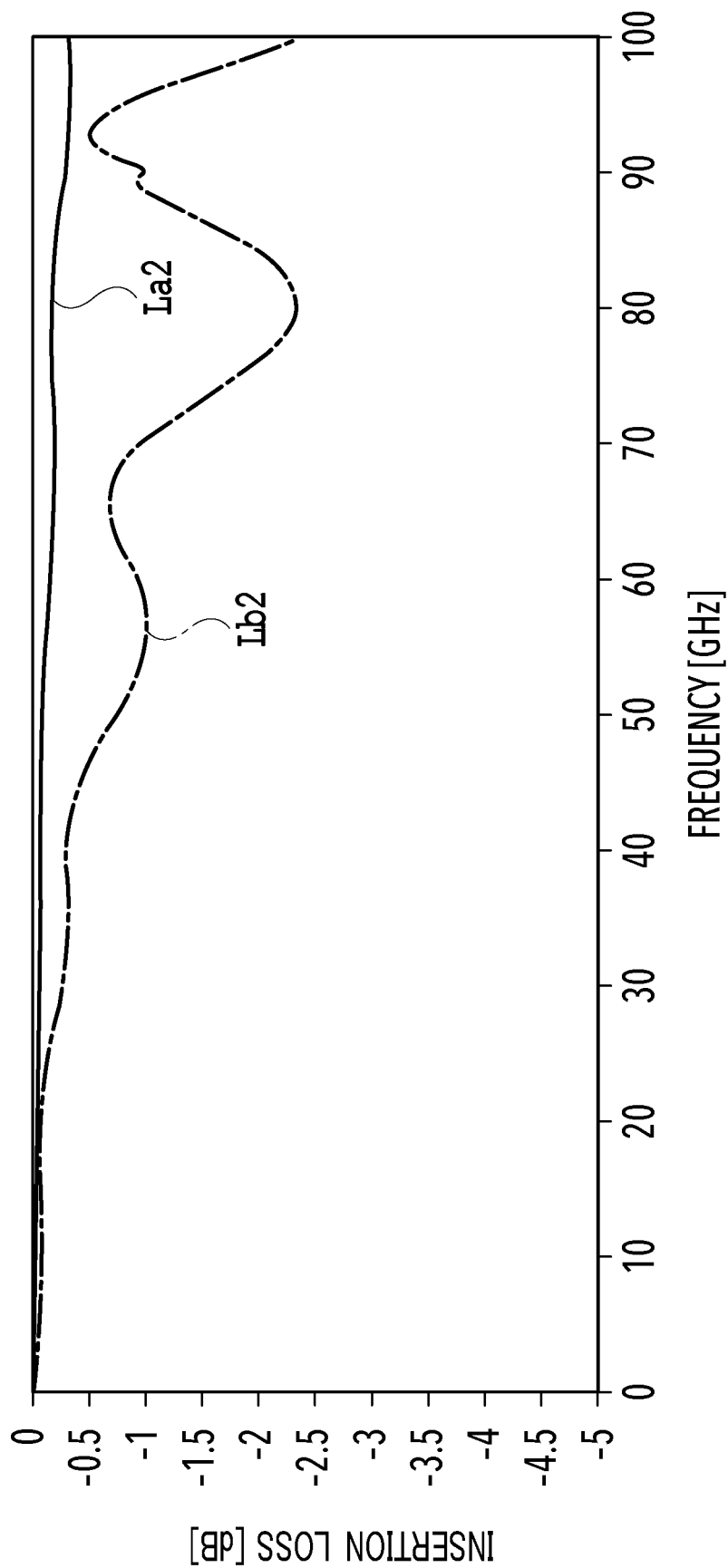
FIG. 13 is a characteristic diagram representing characteristic lines of insertion losses of the first embodiment of the IC sockets according to the present invention and of the comparative example.

In FIG. 13, the vertical axis indicates peak values (dB) of the insertion losses and the horizontal axis indicates frequencies (GHz). FIG. 13 depicts a characteristic line Lb2 that represents a variation in peak value of the insertion loss in the comparative example obtained by the prescribed simulator, and a characteristic line La2 that represents a variation in peak value of the insertion loss of the first embodiment of the IC socket according to the present invention obtained by the prescribed simulator.

As apparent from the characteristic line La2 in FIG. 13, in the first embodiment of the IC socket according to the present invention, no ripples are observed in the range from about 60 to 90 GHz, for example, as compared to the characteristic line Lb2. In addition, the characteristic line La2 shows that the insertion loss is stabilized below −0.5 dB.

Figure 14A:
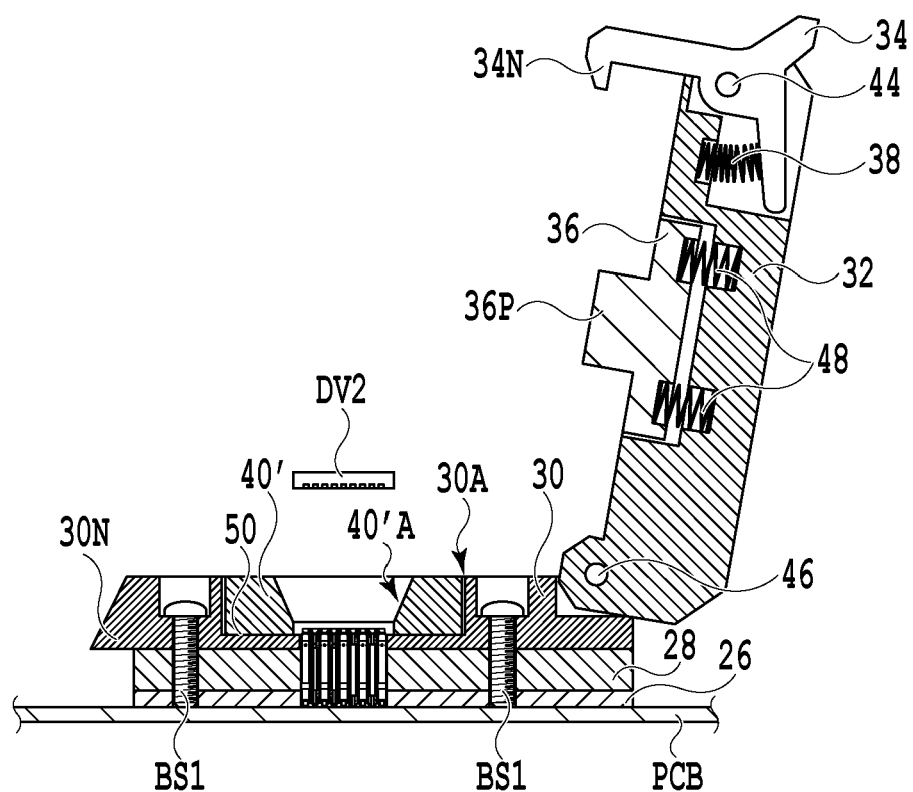
FIG. 14A is a cross-sectional view schematically showing an overall configuration of a second embodiment of an IC socket according to the present invention.

FIG. 14A schematically shows a configuration of a second embodiment of an IC socket according to the present invention.

In FIG. 14A, a plurality of IC sockets are disposed on the printed wiring board PCB serving as the test board, for example. Note that FIG. 14A representatively illustrates one IC socket on the printed wiring board PCB. Here, constituents in FIGS. 14A, 14B, and 15 which are the same as the constituents in FIGS. 2A, 2B, and 2C will be denoted by the same reference signs and overlapping explanations thereof will be omitted.

For example, the IC socket includes the pressing mechanism unit of a clam shell type, the upper housing 28, the lower housing 26, and a contact terminal group to be provided inside the upper housing 28 and the lower housing 26.

The pressing mechanism unit includes the base member 30 placed on the upper end surface of the upper housing 28 through a sheet 50, and the lid member 32 rotationally movably supported by the end portion of the base member 30 and movably holding the pressing body 36 that presses an electrode surface of an attached semiconductor device DV2 against the contact terminal group to be described later.

The semiconductor device DV2 includes an integrated circuit inside a QFA type package, for example. A plurality of electrode portions DVb (see FIG. 15) are formed at four side surfaces and a bottom surface portion of the semiconductor device DV2. When the semiconductor device DV2 is positioned at a semiconductor device placing portion to be described later, the respective electrode portions DVb of the semiconductor device DV2 are disposed opposite to respective holes in the sheet 50 made of a resin and provided on the semiconductor device placing portion. The sheet 50 is made of polyimide (PI), for example, and is configured to prevent the respective electrode portions DVb of the semiconductor device DV2 and the base member 30 from coming into contact and causing electrical short circuit when the semiconductor device DV2 is pressed by the pressing projection 36P.

The opening 30A in which a positioning plate 40' to be described later is disposed is formed at the central part of the base member 30.

The positioning plate 40' is fixed to the base member 30 through the sheet 50 by using the plurality of machine screws. The positioning plate 40' is disposed on a surface of the sheet 50 that is disposed on the base member 30. The sheet 50 made of the resin in a predetermined thickness includes a plurality of holes 50*ai* (i=1 to n, n is a positive integer) arranged in a matrix and opposed to open ends of the holes 30*g*, 30*b*, and 30*c* in the base member 30 to be described later. Respective contact portions of the contact terminal group to be described later are inserted into the holes 50*ai*.

The positioning plate 40' includes a semiconductor placing portion 40'A located at its central part where the semiconductor device DV2 is attached to or detached from. The semiconductor placing portion open upward is formed by being surrounded by inclined surface portions on four sides that guide the semiconductor device DV2 at the time of attachment.

Figure 14B:
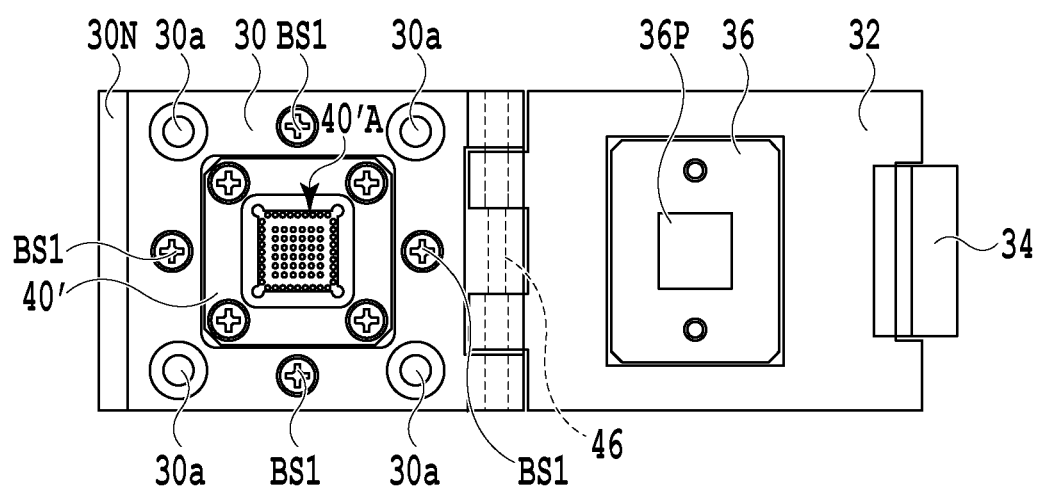
FIG. 14B is a plan view of an example illustrated in FIG. 14A.

As shown in FIG. 14B, the holes 30*a* into which the fixation machine screws (not shown) are to be inserted, respectively, are formed at four corners around the opening 30A so as to correspond to the holes in the upper housing 28 and the lower housing 26. Thus, the base member 30, the upper housing 28, and the lower housing 26 are fixed to the printed wiring board PCB as a consequence of the fixation machine screws being fastened by use of the nuts and the washers through the holes 30*a*, and the through-holes in the upper housing 28, the lower housing 26, and the printed wiring board PCB described above.

Figure 15:
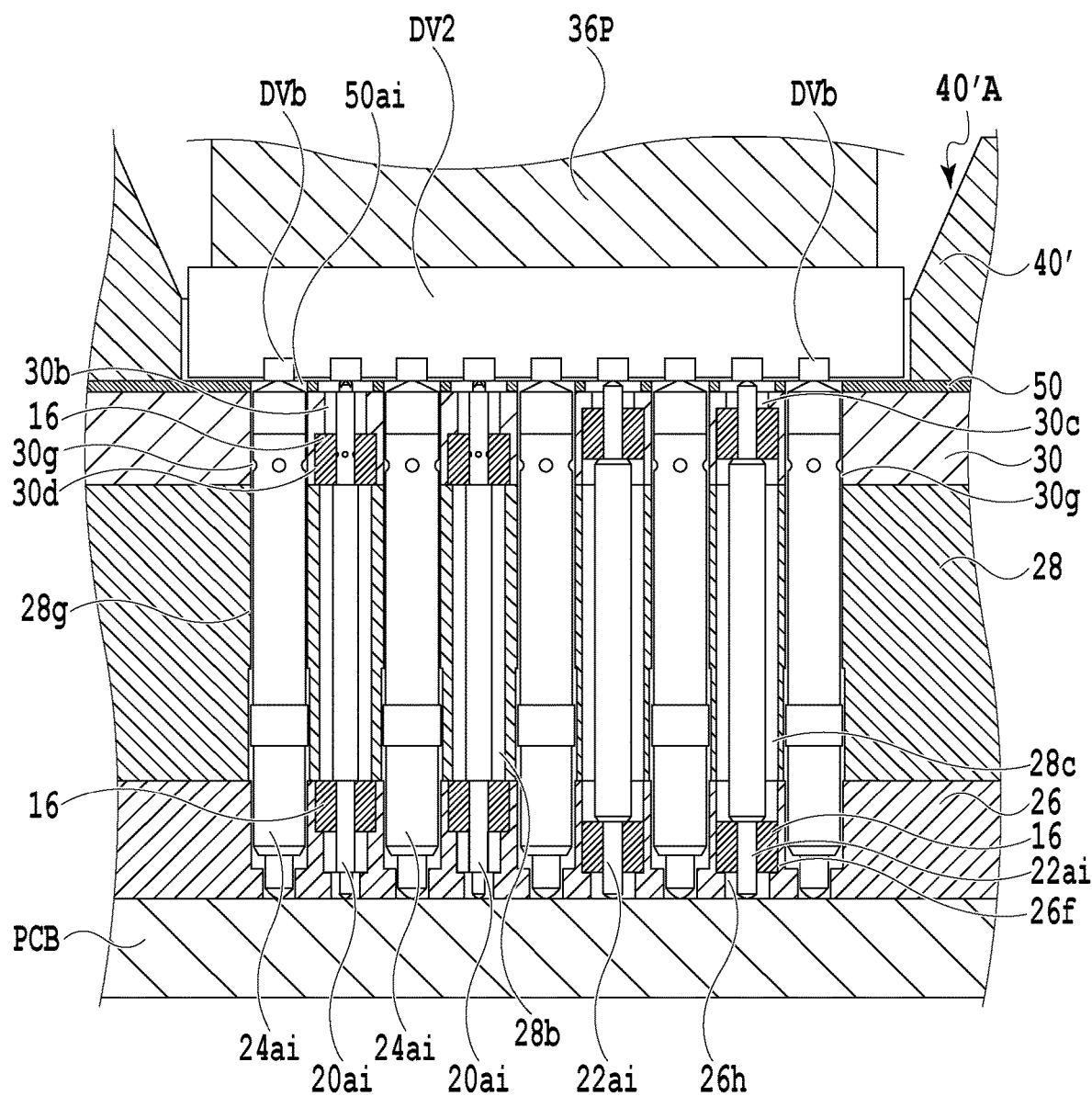
FIG. 15 is a partial cross-sectional view showing an enlarged main part of the example illustrated in FIG. 14A.

As shown in FIG. 15, grounding line contact terminals 24*ai* to be described later are inserted into the holes 30*g* and 28*g*. Signal line contact terminals 20*ai* are inserted into the holes 30*b* and 28*b*. Power supply contact terminals 22*ai* are inserted into the holes 30*c* and 28*c*, respectively. The collar 16 is inserted into each hole 30*d* communicating with the corresponding hole 30*b*.

Accordingly, each signal line contact terminal 20*ai* (i=1 to n, n is a positive integer) is disposed between the adjacent grounding line contact terminals 24*ai*. Moreover, each power supply contact terminal 22*ai* is disposed between the adjacent grounding line contact terminals 24*ai*.

Figure 16A:
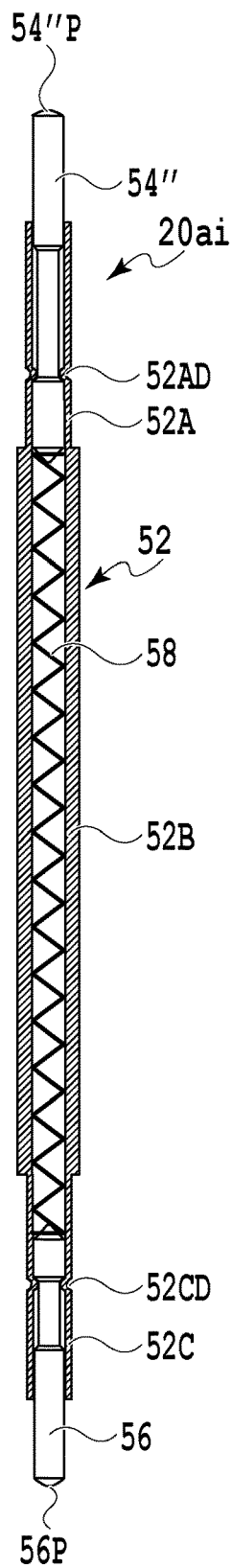
FIG. 16A is a cross-sectional view showing a signal line contact terminal used in the example illustrated in FIG. 14A.
Figure 16B:
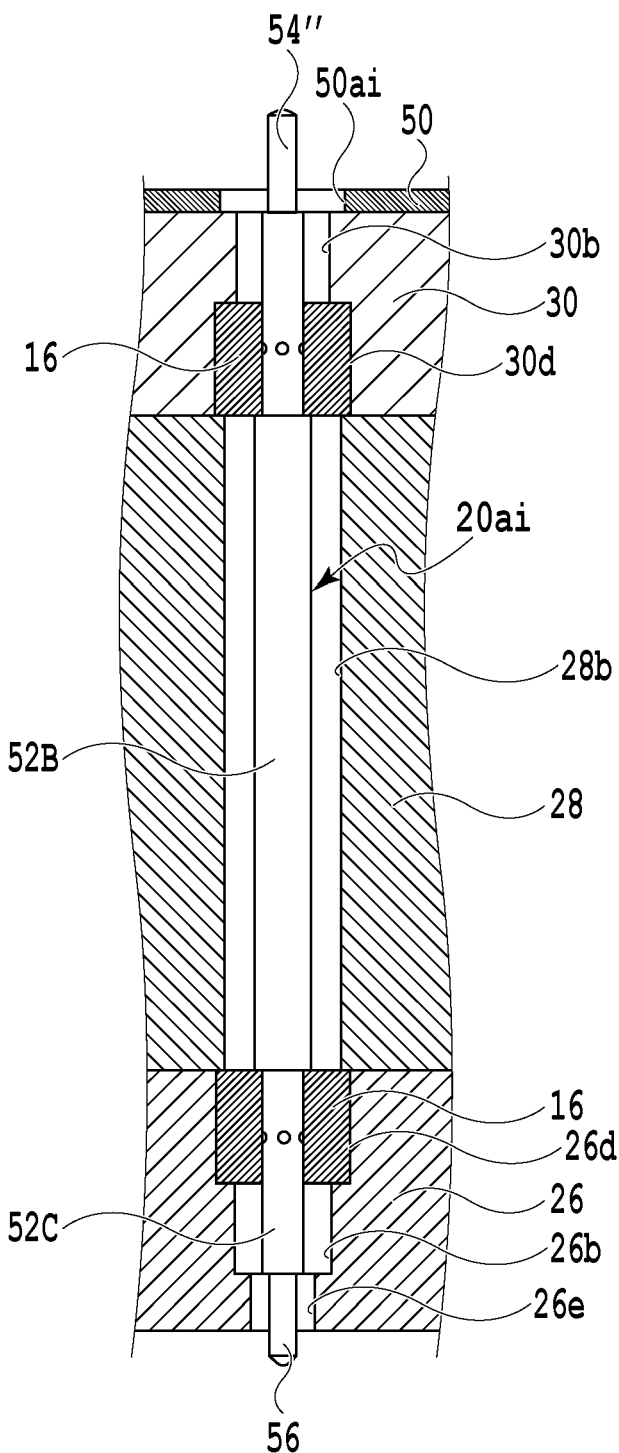
FIG. 16B is a partial cross-sectional view showing a state in which the signal line contact terminal illustrated in FIG. 16A is disposed inside the base member, the upper housing, and the lower housing.

As shown in the enlarged view of FIGS. 16A and 16B, each signal line contact terminal 20*ai* (i=1 to n, n is a positive integer) includes: a plunger 54" provided with a contact portion 54"P configured to selectively come into contact with the corresponding electrode portion DVb of the semiconductor device DV2; the plunger 56 provided with the contact portion 56P configured to come into contact with the corresponding contact pad on the printed wiring board PCB; and the barrel 52 accommodating the coil spring 58 to bias the plunger 54" and the plunger 56 in directions to move away from each other, and configured to connect the plunger 54" to the plunger 56 in such a way as to be capable of coming close to and moving away from each other.

The plunger 54" includes: a contact end portion made of a beryllium copper alloy, for example, and provided with the substantially conical contact portion 54"P formed on one end; the spring receiving portion to receive one end of the coil spring 58; and the connecting portion to connect the contact end portion to the spring receiving portion. Diameters of the contact end portion and the spring receiving portion are made equal to each other, and are set larger than a diameter of the connecting portion. Part of the contact end portion of the plunger 54" projects outward from the end portion of the cylindrical first extending portion 52A of the barrel 52. A step portion formed at a boundary portion between the connecting portion and the spring receiving portion of the plunger 54" is fixed to the plurality of nibs 52AD at the first extending portion 52A. Thus, a movement of the contact end portion of the plunger 54" in a direction toward the electrode portion DVb of the semiconductor device DV2 is controlled and an amount of outward projection of the contact end portion of the plunger 54" is set as appropriate.

In the above-described configuration, when each signal line contact terminal 20*ai* is installed in the hole 28*b* in the upper housing 28 and the hole 26*b* in the lower housing 26 as shown in FIG. 16B, the signal line contact terminal 20*ai* is first inserted into the hole 28*b* in the upper housing 28. Next, the collars 16 are fitted on the outer peripheral portions of the first extending portion 52A and the second extending portion 52C, respectively, and then the upper housing 28 is installed together in such a way as to be sandwiched between the base member 30 and the lower housing 26. At this time, one collar 16 out of the two collars 16 is inserted into the hole 30*d* in the base member 30 while the other collar 16 is inserted into the hole 26*d* in the lower housing 26. In this way, air layers are formed between the outer peripheral portion of the drum portion 52B of the signal line contact terminal 20*ai* and the inner peripheral surface forming the hole 28*b*, between the outer peripheral portion of the first extending portion 52A and an inner peripheral surface forming the hole 30*c*, between the outer peripheral portion of the second extending portion 52C and the inner peripheral surface forming the hole 26*b*, and between the outer peripheral portion of the plunger 56 and the inner peripheral surface forming the hole 26*e*. A tip end portion of the plunger 54" projects from the hole 30*b* in the base member 30 and the corresponding hole 50*ai* in the sheet 50, while the tip end portion of the plunger 56 projects from the hole 26*e* toward the printed wiring board PCB.

Accordingly, when the semiconductor device DV2 is mounted on the positioning plate 40' in the state where the upper housing 28 and the lower housing 26 are sandwiched and installed between the base member 30 and the printed wiring board PCB, each of the cross sections of the base member 30, the upper housing 28, and the lower housing 26 intersecting each signal line contact terminal 20*ai* forms the so-called coaxial probe structure. Thus, the impedance matching is achieved. Moreover, as shown in FIG. 16B, the tip end portion of the plunger 54" is disposed inside the corresponding hole 50*ai* in the sheet 50 and is set to a state of achieving impedance matching to the vicinity of the electrode portion DVb of the semiconductor device DV2. For this reason, the inventor has confirmed that a transmission performance of a signal in a relatively high frequency band is enhanced.

Figure 17A:
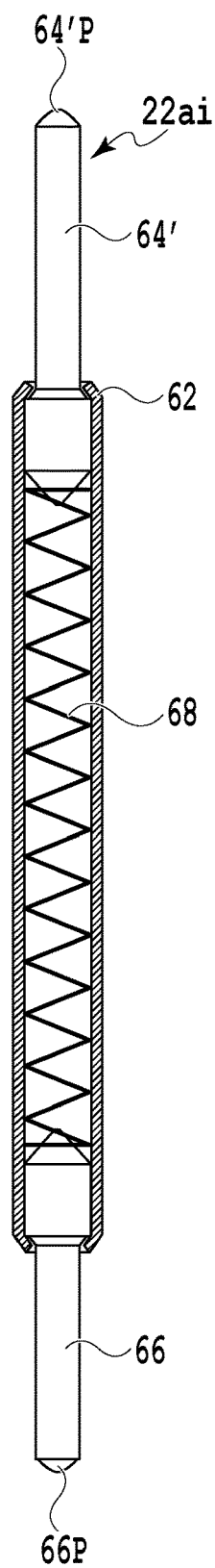
FIG. 17A is a cross-sectional view showing a power supply line contact terminal used in the example illustrated in FIG. 14A.
Figure 17B:
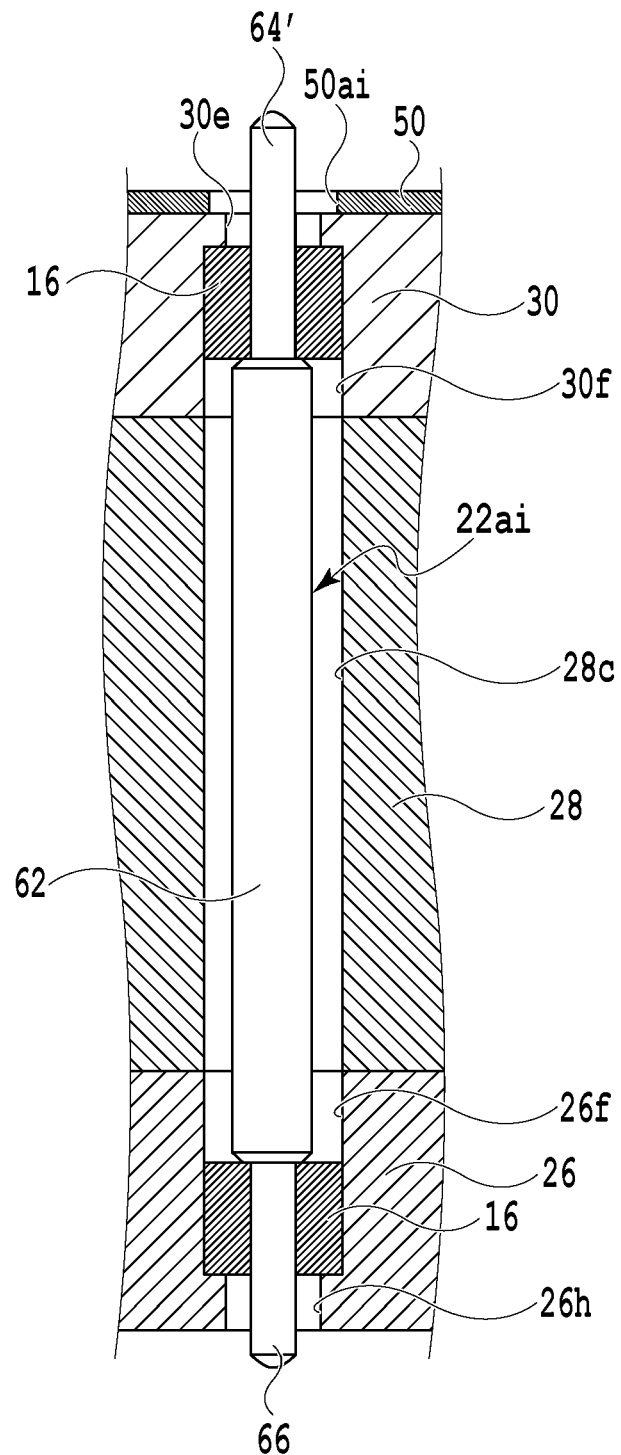
FIG. 17B is a partial cross-sectional view showing a state in which the power supply line contact terminal illustrated in FIG. 17A is disposed inside the base member, the upper housing, and the lower housing.

As shown in the enlarged view of FIGS. 17A and 17B, each power supply contact terminal 22*ai* (i=1 to n, n is a positive integer) includes: a plunger 64' provided with a contact portion 64'P of substantially a conical shape configured to selectively come into contact with the corresponding electrode portion DVb of the semiconductor device DV2; the plunger 66 provided with the contact portion 66P configured to come into contact with the corresponding contact pad on the printed wiring board PCB; and the barrel 62 accommodating the coil spring 68 to bias the plunger 64' and the plunger 66 in directions to move away from each other, and configured to connect the plunger 64' to the plunger 66 in such a way as to be capable of coming close to and moving away from each other.

The plunger 64' includes: a contact end portion made of a beryllium copper alloy, for example, and provided with the substantially conical contact portion 64'P formed on one end; and a spring receiving portion to receive the one end of the coil spring 68. A diameter of the spring receiving portion is set larger than a diameter of the contact end portion. Part of the contact end portion of the plunger 64' projects outward from one of the open end portions of the barrel 62 to be described later. A step portion formed at a boundary portion between the contact end portion and the spring receiving portion of the plunger 64' is fixed to the periphery of the open end portion of the barrel 62. Thus, a movement of the contact end portion of the plunger 64' in a direction toward the electrode portion DVb of the semiconductor device DV2 is controlled and an amount of outward projection of the contact end portion of the plunger 64' is set as appropriate.

In the above-described configuration, when each power supply contact terminal 22ai is installed in the hole 28c in the upper housing 28 and the hole 26f in the lower housing 26 as shown in FIG. 17B, the power supply contact terminal 22ai is first inserted into the hole 28c in the upper housing 28. Next, the collars 16 are fitted on outer peripheral portions of the plungers 64' and 66, respectively, and then the upper housing 28 is installed together in such a way as to be sandwiched between the base member 30 and the lower housing 26. At this time, one collar 16 out of the two collars 16 is inserted into the hole 30f in the base member 30 while the other collar 16 is inserted into the hole 26f in the lower housing 26. In this way, air layers are formed between the outer peripheral portion of the barrel 62 of the power supply contact terminal 22ai and the inner peripheral surface forming the hole 28c, between the outer peripheral portion of the barrel 62 and the inner peripheral surface forming the hole 30f, between an outer peripheral portion of the plunger 64' and the inner peripheral surface forming the hole 30e, between the outer peripheral portion of the barrel 62 and the inner peripheral surface forming the hole 26f, and between the outer peripheral portion of the plunger 66 and the inner peripheral surface forming the hole 26h.

Figure 18A:
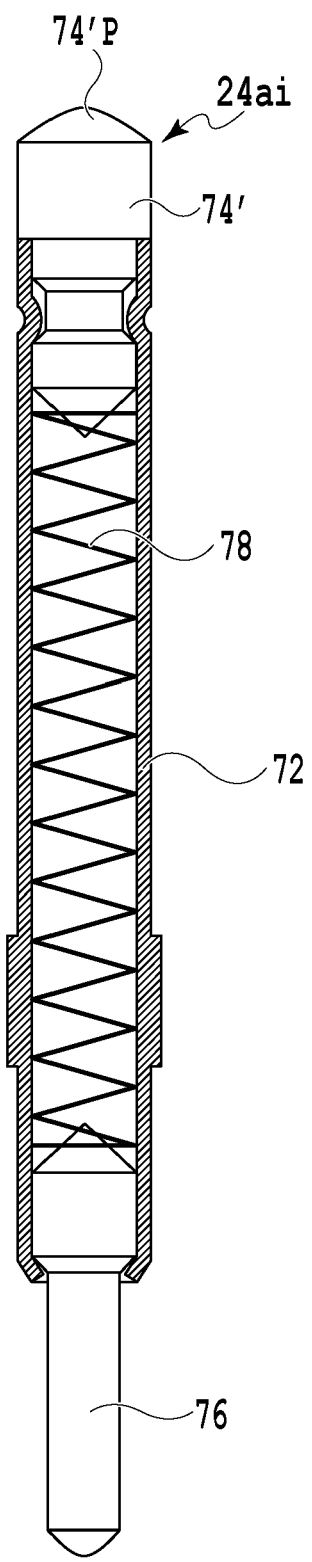
FIG. 18A is a cross-sectional view showing a grounding line contact terminal used in the example illustrated in FIG. 14A.
Figure 18B:
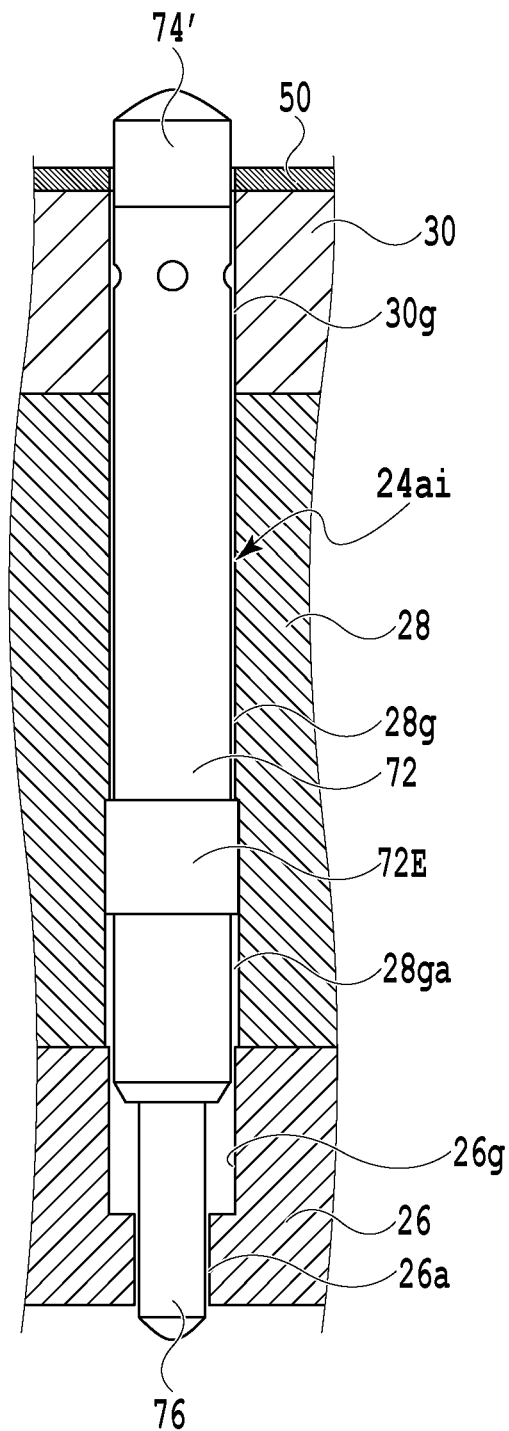
FIG. 18B is a partial cross-sectional view showing a state in which the grounding line contact terminal illustrated in FIG. 18A is disposed inside the base member, the upper housing, and the lower housing.

As shown in the enlarged view of FIGS. 18A and 18B, each grounding line contact terminal 24ai (i=1 to n, n is a positive integer) includes: a plunger 74' provided with a contact portion 74'P of substantially a conical shape configured to selectively come into contact with the corresponding electrode portion DVb of the semiconductor device DV2; the plunger 76 provided with the contact portion 76P configured to come into contact with the corresponding contact pad on the printed wiring board PCB; and the barrel 72 accommodating the coil spring 78 to bias the plunger 74' and the plunger 76 in directions to move away from each other, and configured to connect the plunger 74' to the plunger 76 in such a way as to be capable of coming close to and moving away from each other.

The plunger 74' includes: a contact end portion made of a beryllium copper alloy, for example, and provided with the substantially conical contact portion 74'P formed on one end; a spring receiving portion to receive one end of the coil spring 78; and a connecting portion to connect the contact end portion to the spring receiving portion. Diameters of the contact end portion and the spring receiving portion are made equal to each other, and are set larger than a diameter of the connecting portion. Part of the contact end portion of the plunger 74' projects outward from one of the open end portions of the barrel 72 to be described later. A step portion formed at a boundary portion between the connecting portion and the spring receiving portion of the plunger 74' is fixed to the plurality of nibs 72AD at the barrel 72.

In the above-described configuration, when each grounding line contact terminal 24ai is installed in the hole 28g in the upper housing 28 and the hole 26g in the lower housing 26 as shown in FIG. 18B, the grounding line contact terminal 24ai is first inserted into the hole 28g in such a way that the plunger 74' is inserted from the large-diameter portion 28g a side, which communicates with the hole 28g in the upper housing 28. Next, the upper housing 28 is installed together in such a way as to be sandwiched between the base member 30 and the lower housing 26. At this time, the plunger 74' is inserted into the hole 30g in the base member 30 and the corresponding hole 50ai in the sheet 50 while the plunger 76 is inserted into the holes 26g and 26a in the lower housing 26. In this way, the contact portion 72E comes into contact with the inner peripheral surface of the large-diameter portion 28g a, and the step portion between the contact portion 72E and the remaining portion of the barrel 72 is fixed to the end of the large-diameter portion 28ga. Thus, a position in a direction of the center axis of the grounding line contact terminal 24ai is controlled. In this way, the barrel 72 is made capable of being conducted to the upper housing 28 and the lower housing 26.

Moreover, a tip end portion of the plunger 74' projects from the hole 30g in the base member 30 and the hole 50ai in the sheet 50, while the tip end portion of the plunger 76 projects from the hole 26a toward the printed wiring board PCB.

Note that the above-described examples of the IC socket shown in FIGS. 2A, 2B, 2C, 14A, and 14B include the pressing mechanism unit of a clam shell type. However, the pressing mechanism unit of this type does not always have to be provided. As shown in Japanese Patent Application Publication No. 2012-098219, for instance, a semiconductor device held by a robot hand may be directly pressed against contact portions of a contact terminal group at a semiconductor device placing portion. Moreover, one signal line contact terminal 10ai and one signal line contact terminal 20ai described above is disposed between the grounding line contact terminals 14ai and the grounding line contact terminals 24ai, respectively. However, the present invention is not limited only to these examples. For instance, two signal line contact terminals 10ai and two signal line contact terminal 20ai may be disposed between the grounding line contact terminals 14ai and the grounding line contact terminals 24ai, respectively, each with a prescribed interval therebetween.

The invention claimed is:

1. An IC socket comprising:

an upper housing made of an electrically conductive material and including a plurality of holes configured to individually accommodate a plurality of contact terminals at given clearance, the contact terminals corresponding to at least signal lines in a semiconductor device to be connected, each hole having open ends provided on both ends and configured to allow passage of each contact terminal;

a base member made of an electrically conductive material, provided on one of end surfaces of the upper housing, including holes each configured to allow passage of a first plunger of each of the contact terminals while retaining a predetermined clearance, and configured to support the first plunger inside each hole through a first collar made of a dielectric body and disposed in the base member; and a lower housing made of an electrically conductive material, provided on the other of end surfaces of the upper housing, including holes each configured to allow passage of a second plunger of each of the contact terminals while retaining a predetermined clearance, and configured to support the second plunger inside each hole through a second collar made of a dielectric body and disposed in the lower housing.

2. The IC socket according to claim 1, wherein
the contact terminal comprises:
the first plunger and the second plunger;
an elastic member configured to bias the first plunger and the second plunger in directions to move away from each other; and
a barrel configured to accommodate the first plunger, the second plunger, and the elastic member,
the barrel has a first extending portion and a second extending portion provided at an end portion of the barrel and another end portion of the barrel, respectively, and configured to slidably guide the first plunger and the second plunger inside, and
the first extending portion and the second extending portion are supported by the first collar and the second collar, respectively.

3. The IC socket according to claim 2, wherein a diameter of a contact portion formed at a contact end portion of the first plunger of the contact terminal is set larger than a diameter of the another portion of the contact end portion, and set substantially equal to an outside diameter of the first extending portion of the barrel.

4. The IC socket according to claim 2, wherein
the first extending portion has an outer diameter different from an outer diameter of a drum portion of the barrel and the second extending portion has an outer diameter different from the outer diameter of the drum portion of the barrel.

5. The IC socket according to claim 1, wherein an air layer is formed between an inner peripheral surface forming the hole in the upper housing and an outer peripheral portion of the contact terminal.

6. The IC socket according to claim 1, wherein the semiconductor device to be connected is placed on the base member through a sheet made of a resin and having a plurality of holes configured to allow passage of a contact portion of the contact terminal.

7. The IC socket according to claim 1, wherein the upper housing and the lower housing are grounded.

8. An IC socket comprising:
an upper housing made of an electrically conductive material and including a plurality of holes configured to individually accommodate a plurality of contact terminals at given clearance, the contact terminals corresponding to at least signal lines in a semiconductor device to be connected, each hole having open ends provided on both ends and configured to allow passage of each contact terminal;
a base member made of an electrically conductive material, provided on one of end surfaces of the upper housing, including holes each configured to allow passage of a first plunger of each of the contact terminals while retaining a predetermined clearance, and configured to support the first plunger inside each hole through a collar made of a dielectric body; and
a lower housing made of an electrically conductive material, provided on the other of end surfaces of the upper housing, including holes each configured to allow passage of a second plunger of each of the contact terminals while retaining a predetermined clearance, and configured to support the second plunger inside each hole through a collar made of a dielectric body, wherein
the contact terminal comprises:
the first plunger and the second plunger;
an elastic member configured to bias the first plunger and the second plunger in directions to move away from each other; and
a barrel configured to accommodate the first plunger, the second plunger, and the elastic member,
the barrel has an extending portion provided at an end portion of the barrel and configured to slidably guide any one of the first plunger and the second plunger inside, and
the extending portion is supported by the collar made of a low dielectric body.

* * * * *